(12) United States Patent
Shih

(10) Patent No.: US 11,621,341 B2
(45) Date of Patent: Apr. 4, 2023

(54) SEMICONDUCTOR DEVICE AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 72 days.

(21) Appl. No.: 16/820,273

(22) Filed: Mar. 16, 2020

(65) Prior Publication Data
US 2021/0288160 A1 Sep. 16, 2021

(51) Int. Cl.
| H01L 29/66 | (2006.01) |
| H01L 21/8238 | (2006.01) |
| H01L 21/762 | (2006.01) |
| H01L 29/423 | (2006.01) |
| H01L 29/78 | (2006.01) |
| H01L 29/49 | (2006.01) |

(52) U.S. Cl.
CPC .... *H01L 29/6653* (2013.01); *H01L 21/76224* (2013.01); *H01L 21/823814* (2013.01); *H01L 21/823864* (2013.01); *H01L 29/42356* (2013.01); *H01L 29/4983* (2013.01); *H01L 29/66545* (2013.01); *H01L 29/66553* (2013.01); *H01L 29/66636* (2013.01); *H01L 29/7834* (2013.01)

(58) Field of Classification Search
CPC ........... H01L 29/6653; H01L 21/76224; H01L 21/823814
See application file for complete search history.

(56) References Cited

U.S. PATENT DOCUMENTS

| 6,580,132 | B1* | 6/2003 | Chan | H01L 29/4908 257/347 |
| 2003/0203560 | A1* | 10/2003 | Ryu | H01L 27/092 257/E27.062 |
| 2006/0131652 | A1* | 6/2006 | Li | H01L 21/28194 257/E21.639 |
| 2010/0025770 | A1* | 2/2010 | Trentzsch | H01L 21/823857 257/E21.334 |
| 2017/0200738 | A1* | 7/2017 | Kim | H01L 29/78696 |
| 2018/0175035 | A1* | 6/2018 | Yang | H01L 21/823468 |

FOREIGN PATENT DOCUMENTS

| TW | 201913821 A | 4/2019 |
| TW | 202006832 A | 2/2020 |

OTHER PUBLICATIONS

Office Action of TW Application No. 110104648, dated Nov. 3, 2021, 6 pages.

* cited by examiner

*Primary Examiner* — Errol V Fernandes
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate including a first region, and a first transistor positioned in the first region. The first transistor includes a first bottom gate structure positioned on the substrate, a first channel layer positioned on the first bottom gate structure, a first top gate structure positioned on the first channel layer, and two first source/drain regions positioned on two sides of the first channel layer.

16 Claims, 26 Drawing Sheets

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with a channel layer controlled by multiple gate structures and a method for fabricating the semiconductor device with the channel layer controlled by multiple gate structures.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the demand for greater computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including a first region, and a first transistor positioned in the first region. The first transistor includes a first bottom gate structure positioned on the substrate, a first channel layer positioned on the first bottom gate structure, a first top gate structure positioned on the first channel layer, and two first source/drain regions positioned on two sides of the first channel layer.

In some embodiments, the first bottom gate structure includes a first bottom gate electrode positioned on the substrate, two first bottom gate spacers positioned on two sides of the first bottom gate electrode, and a first bottom gate dielectric positioned between the first bottom gate electrode and the first channel layer.

In some embodiments, the first top gate structure includes a first top gate dielectric positioned on the first channel layer, a first bottom work function layer positioned on the first top gate dielectric, and a first filler layer positioned on the first bottom work function layer.

In some embodiments, the first bottom work function layer has a thickness between about 10 angstroms and about 200 angstroms.

In some embodiments, the semiconductor device includes a first top work function layer positioned between the first bottom work function layer and the first filler layer.

In some embodiments, the first top work function layer has a thickness between about 10 angstroms and about 100 angstroms.

In some embodiments, the semiconductor device includes two first top gate spacers positioned on two sides of the first top gate dielectric.

In some embodiments, the semiconductor device includes two first contacts positioned on the two first source/drain regions.

In some embodiments, the semiconductor device includes two first conductive layers positioned between the two first contacts and the two first source/drain regions.

In some embodiments, each of the two first conductive layers has a thickness between about 2 nm and about 20 nm.

In some embodiments, the semiconductor device includes a first bottom insulating layer positioned below the first bottom gate structure.

In some embodiments, the semiconductor device includes a first channel separation layer positioned below the first bottom insulating layer. The first channel separation layer is doped with phosphorus, arsenic, antimony, or boron.

In some embodiments, the semiconductor device includes a first buffer layer positioned below the first bottom insulating layer. The first buffer layer has a lattice constant different from a lattice constant of the substrate.

In some embodiments, the semiconductor device includes a second transistor positioned in a second region of the substrate. The second transistor includes a second bottom gate structure positioned on the substrate, a second channel layer positioned on the second bottom gate structure, and a second top gate structure positioned on the first channel layer. The second channel layer is at a same vertical level as the first channel layer.

In some embodiments, the first top gate structure includes a second top gate dielectric positioned on the second channel layer. The second top gate dielectric has a thickness less than a thickness of the first top gate dielectric.

Another aspect of the present disclosure provides a method for fabricating a semiconductor device including providing a substrate, forming a first bottom gate structure on the substrate, forming a first channel layer on the first bottom gate structure, forming a first top gate structure on the first channel layer, and forming two first source/drain regions on two sides of the first channel layer.

In some embodiments, the first channel layer is formed of silicon, germanium, silicon germanium, indium gallium arsenide, indium arsenide, gallium antimonide, indium antimonide, or a combination thereof.

In some embodiments, the step of forming the first bottom gate structure includes forming a layer of first semiconductor material, a layer of first insulating material, and a layer of second semiconductor material on the substrate; forming a first dummy structure on the layer of second semiconductor material; performing an etch process to form a plurality of recesses; performing a lateral etch process to form a plurality of lateral recesses; and forming two first bottom gate spacers in the plurality of lateral recesses. After the etch process, the layer of first insulating material is turned into a first bottom gate dielectric and the layer of second semiconductor material is turned into the first channel layer. After the lateral etch process, the layer of first semiconductor material is turned into the first bottom gate electrode. The first bottom gate electrode, the two first bottom gate spacers, and the first bottom gate dielectric together form the first bottom gate structure.

In some embodiments, the two first bottom gate spacers are formed of silicon oxide, silicon nitride, silicon oxynitride, or silicon nitride oxide.

In some embodiments, the two first bottom gate spacers have a porosity between about 10% and about 100%.

Due to the design of the semiconductor device of the present disclosure, the conductive status of the first channel layer may be control by both the first bottom gate structure and the first top gate structure. As a result, the leakage current in the first channel layer may be reduced. In addition, the first top gate dielectric and the second top gate dielectric, which have different thicknesses, may have different threshold voltages and may provide different functions; therefore, the applicability of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
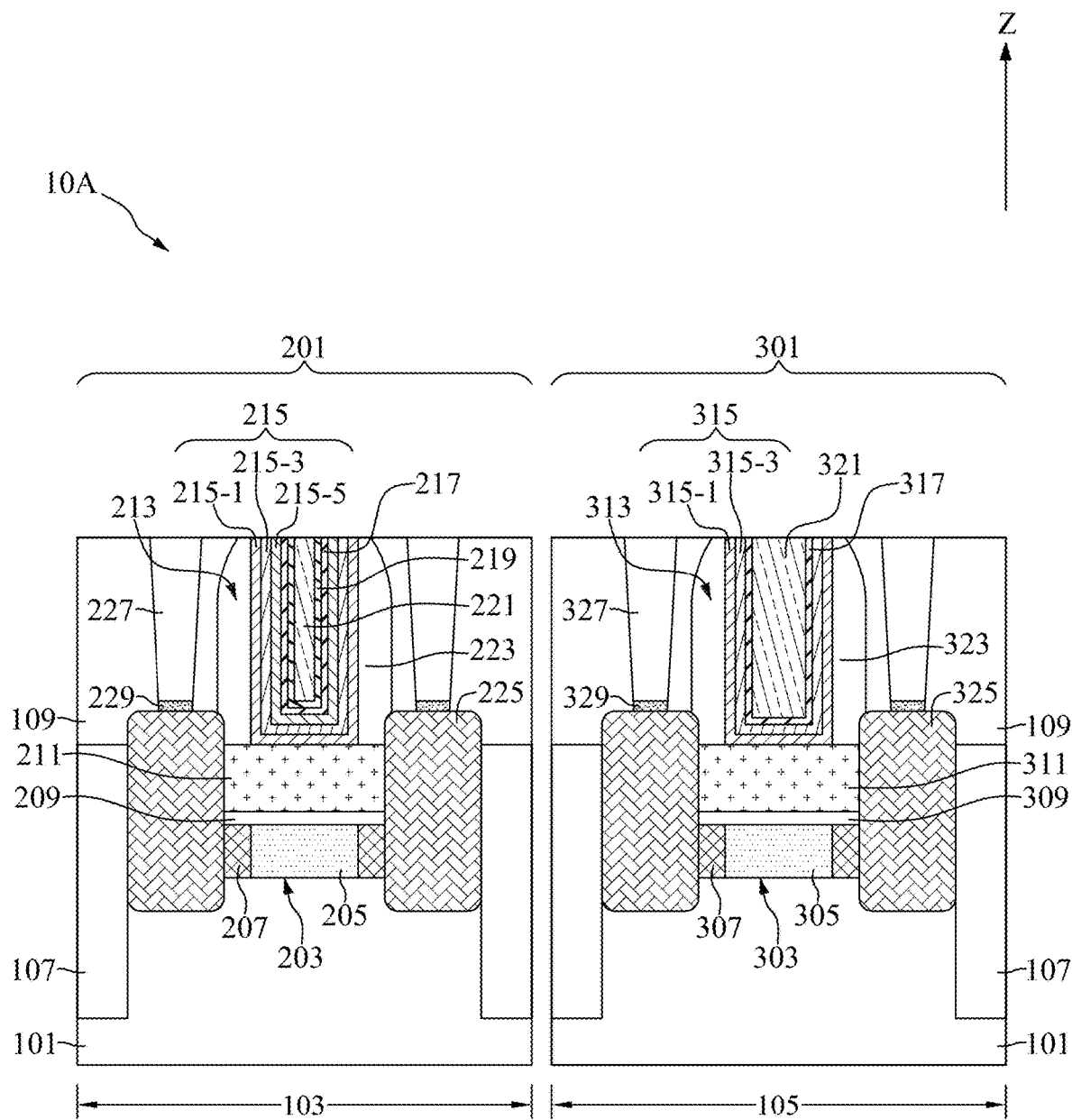
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that the term "about" modifying the quantity of an ingredient, component, or reactant of the present disclosure refers to variation in the numerical quantity that can occur, for example, through typical measuring and liquid-handling procedures used for making concentrates or solutions. Furthermore, variation can occur from inadvertent error in measuring procedures, differences in the manufacture, source, or purity of the ingredients employed to make the compositions or carry out the methods, or the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

Figure 2:
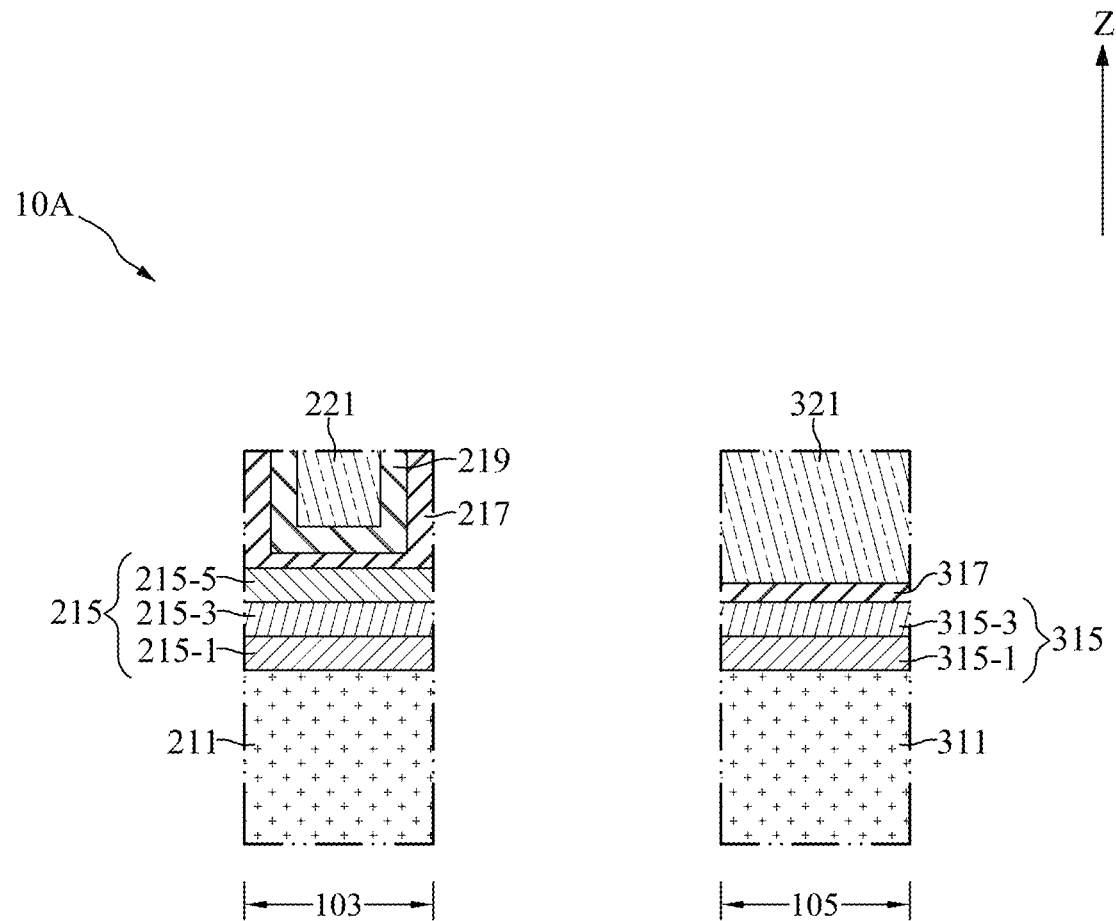
FIG. 2 illustrates, in a schematic enlarged cross-sectional view diagram, the semiconductor device in accordance with FIG. 1.

FIG. 1 illustrates, in a schematic cross-sectional diagram, a semiconductor device 10A in accordance with one embodiment of the present disclosure. FIG. 2 illustrates, in a schematic enlarged cross-sectional view diagram, the semiconductor device 10A in accordance with FIG. 1.

With reference to FIG. 1, the semiconductor device 10A may include a substrate 101, a plurality of isolation structures 107, a first insulating layer 109, a first transistor 201, and a second transistor 301.

With reference to FIGS. 1 and 2, the substrate 101 may include a first region 103 and a second region 105. The first region 103 and the second region 105 may be disposed adjacent to each other. In some embodiments, the first region 103 and the second region 105 may be disposed separated from each other. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant. In some embodiments, the substrate 101 may include an organic semiconductor or a layered semiconductor such as silicon/silicon germanium, silicon-on-insulator or silicon germanium-on-insulator.

It should be noted that the first region 103 may include a portion of the substrate 101 and a space above the portion of the substrate 101. Describing an element as being disposed on the first region 103 means that the element is disposed on a top surface of the portion of the substrate 101. Describing an element as being disposed above the first region 103 means that the element is disposed above the top surface of the portion of the substrate 101. In some embodiments, describing an element as being disposed in the first region 103 means that the element is disposed in the portion of the substrate 101; however, a top surface of the element may be even with the top surface of the portion of the substrate 101. In some embodiments, describing an element as being disposed in the first region 103 means that some portions of the element are disposed in the substrate 101 and other portions of the element are disposed on or above the substrate 101.

Accordingly, the second region 105 may include another portion of the substrate 101 and a space above the other portion of the substrate 101.

With reference to FIGS. 1 and 2, the plurality of isolation structures 107 may be disposed in the first region 103 and the second region 105. Top surfaces of the plurality of isolation structures 107 may be at a vertical level higher than a vertical level of the top surface of the substrate 101. The plurality of isolation structures 107 disposed in the first region 103 may define a first active area. The plurality of isolation structures 107 disposed in the second region 105 may define a second active area. The plurality of isolation structures 107 may be formed of, for example, an insulating material such as silicon oxide, silicon nitride, silicon oxynitride, silicon nitride oxide, or fluoride-doped silicate.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 1 and 2, the first transistor 201 may be disposed in the first region 103 and the second transistor 301 may be disposed in the second region 105. In some embodiments, the first transistor 201 and the second transistor 301 may have a same threshold voltage. In some embodiments, the first transistor 201 and the second transistor 301 may have different threshold voltages. The first transistor 201 may include a first bottom gate structure 203, a first channel layer 211, a first top gate structure 213, two first source/drain regions 225, two first contacts 227, and two first conductive layers 229.

With reference to FIGS. 1 and 2, the first bottom gate structure 203 may be disposed on the first region 103 and between an adjacent pair of the plurality of isolation structures 107 disposed in the first region 103. The first bottom gate structure 203 may include a first bottom gate electrode 205, two first bottom gate spacers 207, and a first bottom gate dielectric 209.

With reference to FIGS. 1 and 2, the first bottom gate electrode 205 may be disposed on the first region 103. The first bottom gate electrode 205 may be formed of, for example, a conductive material such as polycrystalline silicon, polycrystalline silicon germanium, or a combination thereof. In some embodiments, the first bottom gate electrode 205 may be doped with a dopant such as phosphorus, arsenic, antimony, or boron. In some embodiments, the first bottom gate electrode 205 may be formed of, for example, tungsten, aluminum, titanium, copper, tantalum, molybdenum, tantalum nitride, nickel silicide, cobalt silicide, titanium nitride, tungsten nitride, titanium aluminide, titanium aluminum nitride, tantalum carbon nitride, tantalum carbide, tantalum silicon nitride, or a combination thereof.

With reference to FIGS. 1 and 2, the two first bottom gate spacers 207 may be disposed on two sides of the first bottom gate electrode 205. In some embodiments, the interface of the first bottom gate electrode 205 and the two first bottom gate spacers 207 may be curved (not shown in FIG. 1). In some embodiments, the two first bottom gate spacers 207 may be formed of, for example, an insulating material such as silicon oxide, silicon nitride, silicon oxynitride, silicon nitride oxide, or the like.

In some embodiments, the two first bottom gate spacers 207 may be formed from an energy-removable material and may have a porosity between about 10% and about 100%. The two first bottom gate spacers 207 may include a skeleton and a plurality of empty spaces disposed among the skeleton. The plurality of empty spaces may be connected to each other and may be filled with air. The skeleton may include, for example, silicon oxide, low-dielectric materials, or methylsilsesquioxane. It should be noted that, when the porosity is 100%, it means the two first bottom gate spacers 207 include only empty spaces and the two first bottom gate spacers 207 may be regarded as air gaps. In some embodiments, the porosity of the two first bottom gate spacers 207 may be between 45% and 75%. The plurality of empty spaces of the two first bottom gate spacers 207 may be filled with air. As a result, a dielectric constant of the two first bottom gate spacers 207 may be significantly lower than a dielectric constant of a layer formed of, for example, only silicon oxide. Therefore, the two first bottom gate spacers 207 may significantly reduce the parasitic capacitance between the first bottom gate electrode 205 and the two first source/drain regions 225, as illustrated below.

That is, the two first bottom gate spacers 207 may significantly alleviate an interference effect between electrical signals induced in or applied to the first transistor 201.

The energy-removable material may include a material such as a thermal-decomposable material, a photonic-decomposable material, an e-beam decomposable material, or a combination thereof. For example, the energy-removable material may include a base material and a decomposable porogen material that is sacrificially removed upon being exposed to an energy source.

In some embodiments, the energy-removable material may include a relatively high concentration of the decomposable porogen material and a relatively low concentration of the base material, but is not limited thereto. For example, the energy-removable material may include about 75% or greater of the decomposable porogen material, and about 25% or less of the base material. In another example, the energy-removable material may include about 95% or greater of the decomposable porogen material, and about 5% or less of the base material. In another example, the energy-removable material may include about 100% of the decomposable porogen material, and no base material is used. In another example, the energy-removable material may include about 45% or greater of the decomposable porogen material, and about 55% or less of the base material.

With reference to FIGS. 1 and 2, the first bottom gate dielectric 209 may be disposed on the first bottom gate electrode 205 and the two first bottom gate spacers 207. In some embodiments, the first bottom gate dielectric 209 may be formed of, for example, silicon oxide or the like. In some embodiments, the first bottom gate dielectric 209 may be formed of an insulating material having a dielectric constant of about 4.0 or greater.

With reference to FIGS. 1 and 2, the first channel layer 211 may be disposed on the first bottom gate dielectric 209. The first channel layer 211 may be formed of IV, II-IV or III-V semiconductor materials. For example, the first channel layer 211 may include silicon, germanium, silicon germanium, indium gallium arsenide, indium arsenide, gallium antimonide, indium antimonide, or a combination thereof.

With reference to FIGS. 1 and 2, the first top gate structure 213 may be disposed on the first channel layer 211. The first top gate structure 213 may include a first top gate dielectric 215, a first bottom work function layer 217, a first top work function layer 219, a first filler layer 221, and two first top gate spacers 223.

With reference to FIGS. 1 and 2, in the embodiment depicted, the first top gate dielectric 215 may be disposed on the first channel layer 211. The first top gate dielectric 215 may include a first bottom sub-layer 215-1, a first middle sub-layer 215-3, and a first top sub-layer 215-5. The first bottom sub-layer 215-1 may be disposed on the first channel layer 211 and may have a U-shaped cross-sectional profile.

Corner effects may be avoided with the U-shaped cross-sectional profile. The first bottom sub-layer 215-1 may have a thickness between about 0.1 nm and about 3.0 nm. Preferably, the thickness of the first bottom sub-layer 215-1 may be between about 0.5 nm and about 2.5 nm. In some embodiments, the first bottom sub-layer 215-1 may be formed of, for example, silicon oxide, silicon nitride, silicon oxynitride, silicon nitride oxide, or the like. In some embodiments, the first bottom sub-layer 215-1 may be formed of an insulating material having a dielectric constant of about 4.0 or greater.

The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a combination thereof.

With reference to FIGS. 1 and 2, the first middle sub-layer 215-3 may be disposed on the first bottom sub-layer 215-1. The first middle sub-layer 215-3 may have a U-shaped cross-sectional profile. The first middle sub-layer 215-3 may have a thickness between about 0.1 nm and about 2.0 nm. Preferably, the thickness of the first middle sub-layer 215-3 may be between about 0.5 nm and about 1.5 nm. In some embodiments, the first middle sub-layer 215-3 may be formed of, for example, an insulating material having a dielectric constant of about 4.0 or greater. In some embodiments, the first middle sub-layer 215-3 may be formed of, for example, silicon oxide, silicon nitride, silicon oxynitride, silicon nitride oxide, or the like.

With reference to FIGS. 1 and 2, the first top sub-layer 215-5 may be disposed on the first middle sub-layer 215-3. The first top sub-layer 215-5 may have a U-shaped cross-sectional profile. The first top sub-layer 215-5 may have a thickness between about 0.5 nm and about 5.0 nm. Preferably, the thickness of the first top sub-layer 215-5 may be between about 0.5 nm and about 2.5 nm. In some embodiments, the first top sub-layer 215-5 may be formed of, for example, an insulating material having a dielectric constant of about 4.0 or greater. In some embodiments, the first top sub-layer 215-5 may be formed of, for example, silicon oxide, silicon nitride, silicon oxynitride, silicon nitride oxide, or the like.

With reference to FIGS. 1 and 2, the first bottom work function layer 217 may be disposed on the first top gate dielectric 215. Specifically, the first bottom work function layer 217 may be disposed on the first top sub-layer 215-5. The first bottom work function layer 217 may have a U-shaped cross-sectional profile. The first bottom work function layer 217 may have a thickness between about 10 angstroms and about 200 angstroms. Preferably, the thickness of the first bottom work function layer 217 may be between about 10 angstroms and about 100 angstroms. The first bottom work function layer 217 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

With reference to FIGS. 1 and 2, the first top work function layer 219 may be disposed on the first bottom work function layer 217.

The first top work function layer 219 may have a U-shaped cross-sectional profile. The first top work function layer 219 may have a thickness between about 10 angstroms and about 100 angstroms. The first top work function layer 219 may be formed of, for example, titanium nitride, tantalum nitride, tantalum carbide, tungsten nitride, or ruthenium.

With reference to FIGS. 1 and 2, the first filler layer 221 may be disposed on the first top work function layer 219. The first filler layer 221 may be formed of, for example, tungsten or aluminum.

With reference to FIGS. 1 and 2, the two first top gate spacers 223 may be respectively correspondingly disposed on two sides of the first top gate dielectric 215. Specifically, the two first top gate spacers 223 may be respectively correspondingly disposed on two sides of the first bottom sub-layer 215-1. The two first top gate spacers 223 may be formed of, for example, silicon oxide, silicon nitride, or the like.

With reference to FIGS. 1 and 2, the two first source/drain regions 225 may be disposed on two sides of the first bottom gate structure 203 and on two sides of the first channel layer 211. Upper portions of the two first source/drain regions 225 may protrude away from the substrate 101 along the direction Z. The upper portions of the two first source/drain regions 225 may be disposed adjacent to the two first top gate spacers 223. Bottom surfaces of the two first source/drain regions 225 may be at a vertical level lower than bottom surfaces of the two first bottom gate spacers 207. In some embodiments, the bottom surfaces of the two first source/drain regions 225 may be at a vertical level between the vertical level of the bottom surfaces of the two first bottom gate spacers 207 and a vertical level of top surfaces of the two first bottom gate spacers 207. The plurality of isolation structures 107 disposed in the first region 103 may be respectively correspondingly disposed adjacent to the two first source/drain regions 225.

The two first source/drain regions 225 may be formed of, for example, silicon, germanium, silicon germanium, indium gallium arsenide, or silicon carbide. The two first source/drain regions 225 may be doped with a dopant such as phosphorus, arsenic, antimony, or boron. The two first source/drain regions 225 may have a first electrical type. In some embodiments, the two first source/drain regions 225 may have a uniform dopant concentration. In some embodiments, different vertical levels of the two first source/drain regions 225 may have various dopant concentrations. For example, in some embodiments, the upper portions of the two first source/drain regions 225 may have a dopant concentration greater than dopant concentrations of other portions of the two first source/drain regions 225. In some other embodiments, middle portions of the two first source/drain regions 225 may have a dopant concentration greater than dopant concentrations of other portions of the two first source/drain regions 225. In some embodiments, the two first source/drain regions 225 may be formed of a material different from that of the first channel layer 211. For example, the first channel layer 211 may be formed of germanium and the two first source/drain regions 225 may be formed of doped silicon germanium. Accordingly, the first channel layer 211 may include a strained channel. As a result, carrier mobility of the first transistor 201 may be increased.

With reference to FIGS. 1 and 2, the first insulating layer 109 may be disposed on the plurality of isolation structures 107, the first channel layer 211, and the two first source/drain regions 225. The first insulating layer 109 may surround the first top gate structure 213. The first insulating layer 109 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, amorphous fluorinated carbon, organo silicate glass, or a combination thereof.

With reference to FIGS. 1 and 2, the two first contacts 227 may be disposed so as to penetrate the first insulating layer 109 and respectively correspondingly disposed on the two first source/drain regions 225. The two first contacts 227 may have a tapered cross-sectional profile. In some embodiments, a width of the two first contacts 227 may gradually become wider from bottom to top along the direction Z. In some embodiments, sides of the first contact 227 may have a consistent slope. The two first contacts 227 may be formed of, for example, a conductive material such as doped polysilicon, metal, or metal nitride. The metal may be aluminum, copper, tungsten, or cobalt.

With reference to FIGS. 1 and 2, the two first conductive layers 229 may be respectively correspondingly disposed between the two first contacts 227 and the two first source/drain regions 225. Each of the two first conductive layers 229 may have a thickness between about 2 nm and about 20 nm. The two first conductive layers 229 may be formed of, for example, titanium silicide, nickel silicide, nickel platinum silicide, tantalum silicide, or cobalt silicide.

With reference to FIGS. 1 and 2, the second transistor 301 may have a structure similar to that of the first transistor 201, but is not limited thereto. The second transistor 301 may include a second bottom gate structure 303, a second channel layer 311, a second top gate structure 313, two second source/drain regions 325, two second contacts 327, and two second conductive layers 329.

With reference to FIGS. 1 and 2, the second bottom gate structure 303 may be disposed on the second region 105 and between an adjacent pair of the plurality of isolation structures 107 disposed in the second region 105. The second bottom gate structure 303 may be at a same vertical level as the first bottom gate structure 203. The second bottom gate structure 303 may include a second bottom gate electrode 305, two second bottom gate spacers 307, and a second bottom gate dielectric 309.

With reference to FIGS. 1 and 2, the second bottom gate electrode 305 may be disposed on the second region 105. The second bottom gate electrode 305 may be formed of a same material as the first bottom gate electrode 205, but is not limited thereto. The two second bottom gate spacers 307 may be disposed on two sides of the second bottom gate electrode 305. The two second bottom gate spacers 307 may be formed of a same material as the two first bottom gate spacers 207, but are not limited thereto. The second bottom gate dielectric 309 may be disposed on the second bottom gate electrode 305 and the two second bottom gate spacers 307. The second bottom gate dielectric 309 may be formed of a same material as the first bottom gate dielectric 209, but is not limited thereto.

With reference to FIGS. 1 and 2, the second channel layer 311 may be disposed on the second bottom gate dielectric 309. The second channel layer 311 may be at a same vertical level as the first channel layer 211. The second channel layer 311 may be formed of a same material as the second bottom gate dielectric 309, but is not limited thereto.

With reference to FIGS. 1 and 2, the second top gate structure 313 may be disposed on the second channel layer 311. The second top gate structure 313 may include a second top gate dielectric 315, a second bottom work function layer 317, a second filler layer 321, and two second top gate spacers 323.

With reference to FIGS. 1 and 2, the second top gate dielectric 315 may be disposed on the second channel layer 311. The second top gate dielectric 315 may have a thickness less than that of the first top gate dielectric 215. The second top gate dielectric 315 may include a second bottom sub-layer 315-1 and a second middle sub-layer 315-3.

With reference to FIGS. 1 and 2, the second bottom sub-layer 315-1 may be disposed on the second channel layer 311 and may have a U-shaped cross-sectional profile. Corner effects may be avoided with the U-shaped cross-sectional profile. The second bottom sub-layer 315-1 may have a same thickness as the first bottom sub-layer 215-1, but is not limited thereto. The second bottom sub-layer 315-1 may be formed of a same material as the first bottom sub-layer 215-1, but is not limited thereto. The second middle sub-layer 315-3 may be disposed on the second bottom sub-layer 315-1. The second middle sub-layer 315-3 may have a U-shaped cross-sectional profile. The second middle sub-layer 315-3 may have a same thickness as the first middle sub-layer 215-3, but is not limited thereto. The second middle sub-layer 315-3 may be formed of a same material as the first middle sub-layer 215-3, but is not limited thereto.

With reference to FIGS. 1 and 2, the second bottom work function layer 317 may be disposed on the second top gate dielectric 315. Specifically, the second bottom work function layer 317 may be disposed on the second middle sub-layer 315-3. The second bottom work function layer 317 may have a U-shaped cross-sectional profile. The second bottom work function layer 317 may have a same thickness as the first bottom work function layer 217, but is not limited thereto. The second bottom work function layer 317 may be formed of a same material as the first bottom work function layer 217. The second filler layer 321 may be disposed on the second bottom work function layer 317. The second filler layer 321 may be formed of a same material as the first filler layer 221. The two second top gate spacers 323 may be respectively correspondingly disposed on two sides of the second top gate dielectric 315. Specifically, the two second top gate spacers 323 may be respectively correspondingly disposed on two sides of the second bottom sub-layer 315-1. The two second top gate spacers 323 may be formed of a same material as the two first top gate spacers 223, but are not limited thereto.

With reference to FIGS. 1 and 2, the two second source/drain regions 325 may be disposed on two sides of the second bottom gate structure 303 and on two sides of the second channel layer 311. Upper portions of the two second source/drain regions 325 may protrude away from the substrate 101 along the direction Z. The upper portions of the two second source/drain regions 325 may be disposed adjacent to the two second top gate spacers 323. Bottom surfaces of the two second source/drain regions 325 may be at a vertical level lower than bottom surfaces of the two second bottom gate spacers 307. In some embodiments, the bottom surfaces of the two second source/drain regions 325 may be at a vertical level between the vertical level of the bottom surfaces of the two second bottom gate spacers 307 and a vertical level of top surfaces of the two second bottom gate spacers 307. The plurality of isolation structures 107 disposed in the second region 105 may be respectively correspondingly disposed adjacent to the two second source/drain regions 325. The two second source/drain regions 325 may be formed of a same material as the two first source/drain regions 225, but are not limited thereto.

With reference to FIGS. 1 and 2, the two second contacts 327 may be disposed so as to penetrate the first insulating layer 109 and respectively correspondingly disposed on the two second source/drain regions 325. The two second contacts 327 may be formed of a same material as the two first contacts 227, but are not limited thereto. The two second conductive layers 329 may be respectively correspondingly disposed between the two second contacts 327 and the two second source/drain regions 325. The two second conductive layers 329 may have a same thickness as the two first conductive layers 229, but are not limited thereto. The two second conductive layers 329 may be formed of a same material as the two first conductive layers 229, but are not limited thereto.

While operating the semiconductor device 10A, the first bottom gate structure 203, the first top gate structure 213, the second bottom gate structure 303, and the second top gate structure 313 may be electrically coupled to different voltage supplies. The conductive status of the first channel layer 211 may be controlled by both the first bottom gate structure 203 and the first top gate structure 213. As a result, the leakage current in the first channel layer 211 may be reduced. Accordingly, the conductive status of the second channel layer 311 may be controlled by both the second bottom gate structure 303 and the second top gate structure 313. In some embodiments, the first bottom gate structure 203 and the first top gate structure 213 may be electrically coupled to a same voltage supply.

Figure 3:
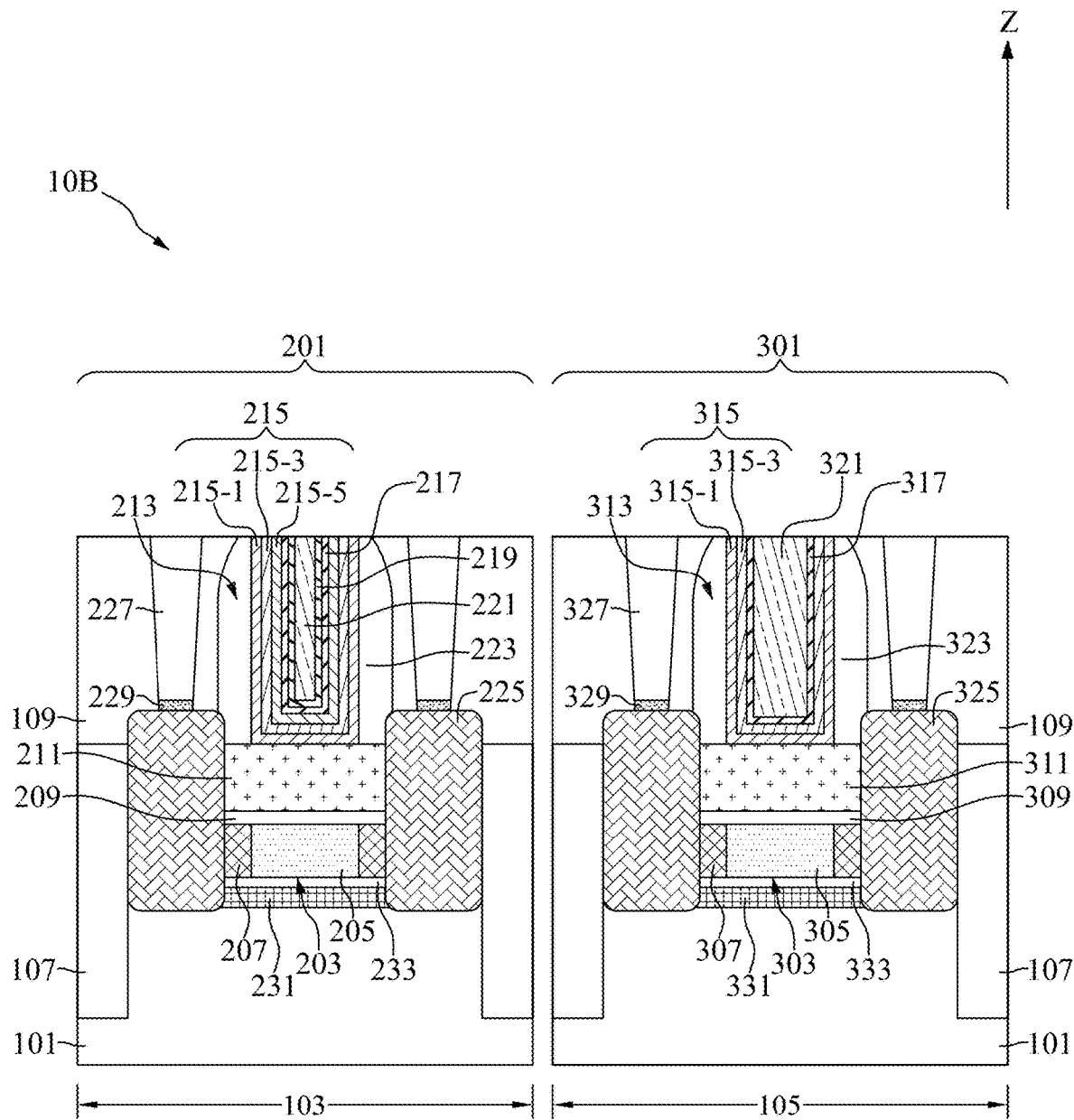
FIGS. 3 to 5 illustrate, in schematic cross-sectional diagrams, semiconductor devices in accordance with embodiments of the present disclosure.
Figure 4:
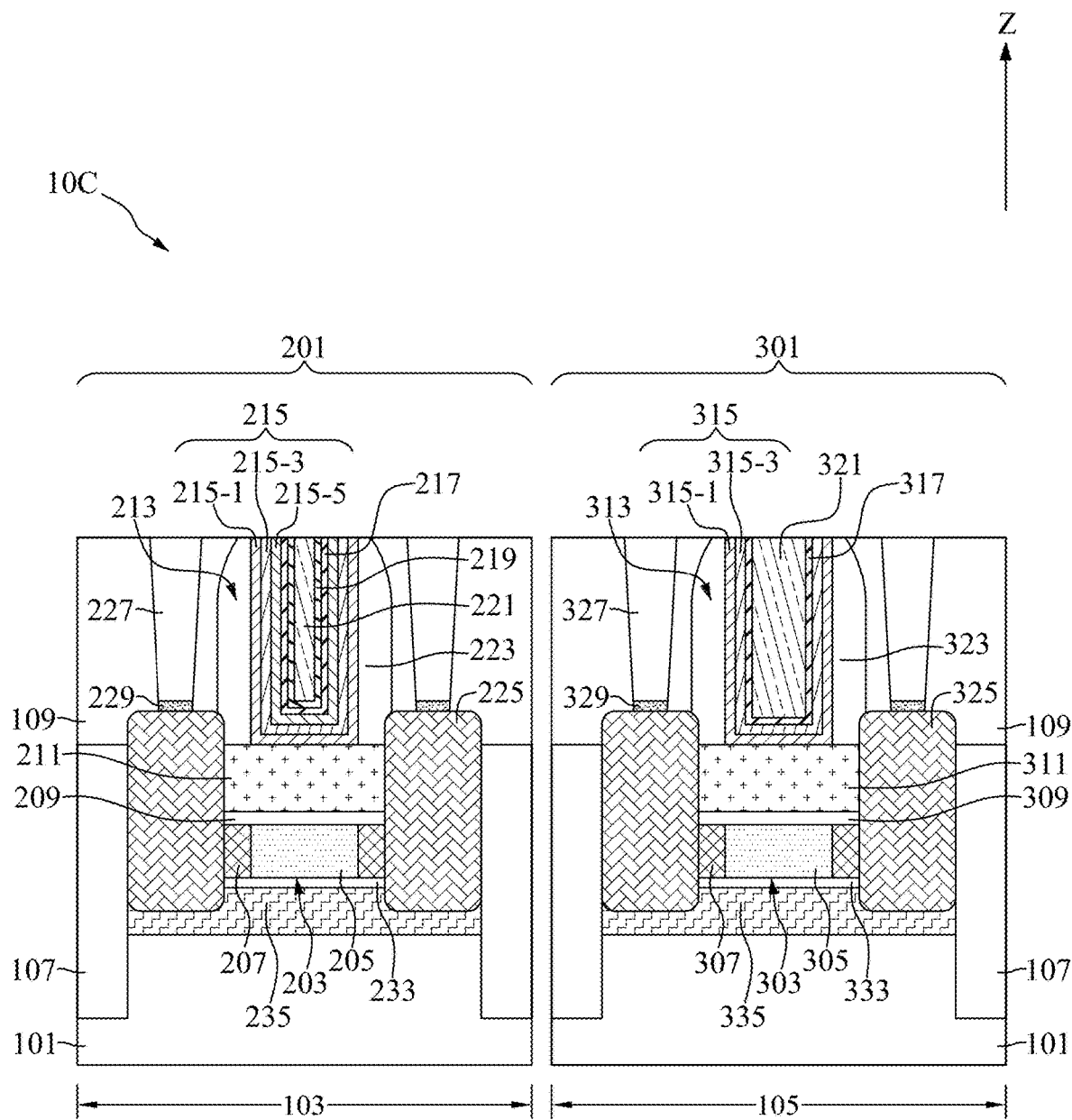
Figure 5:
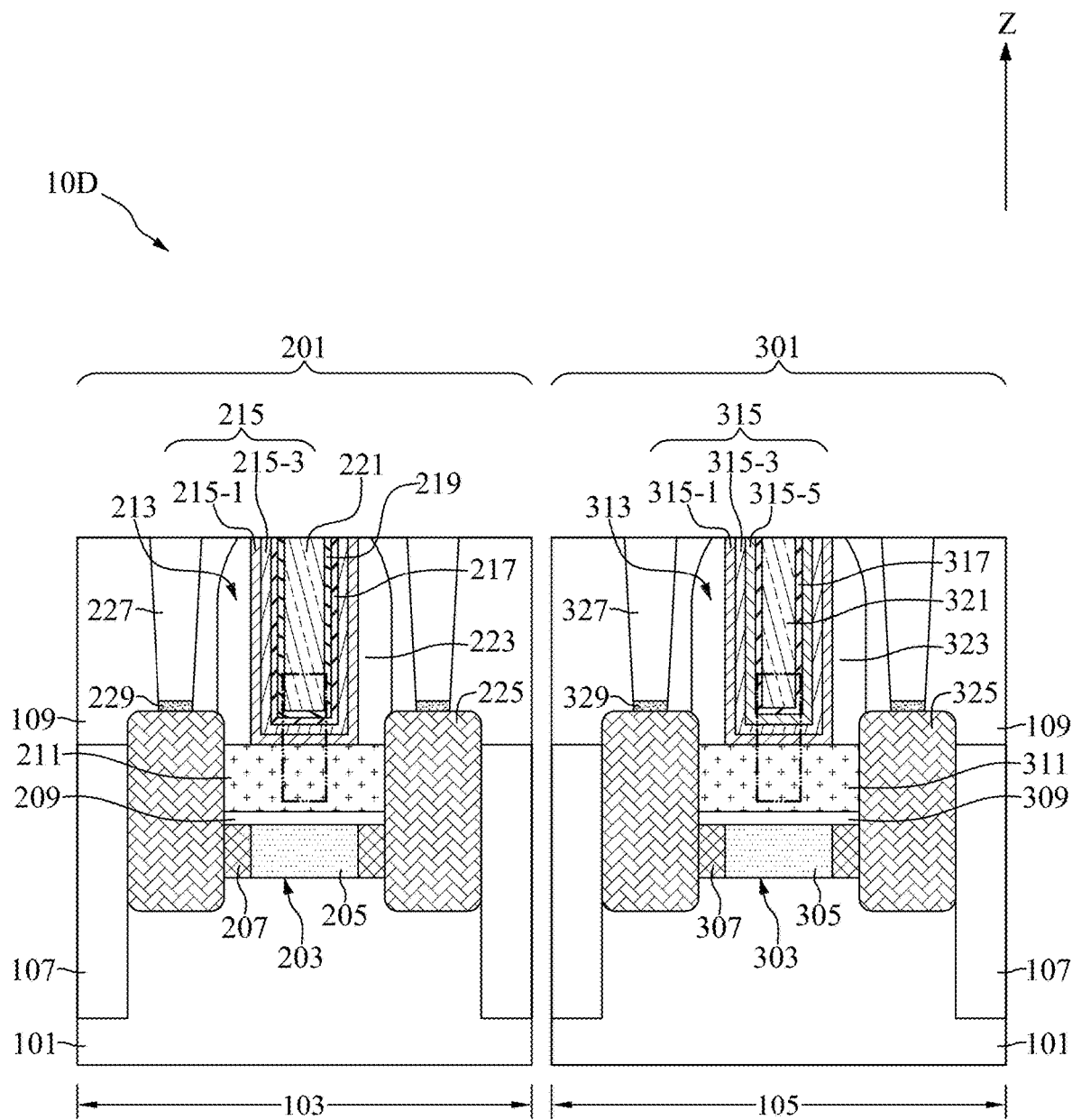
Figure 6:
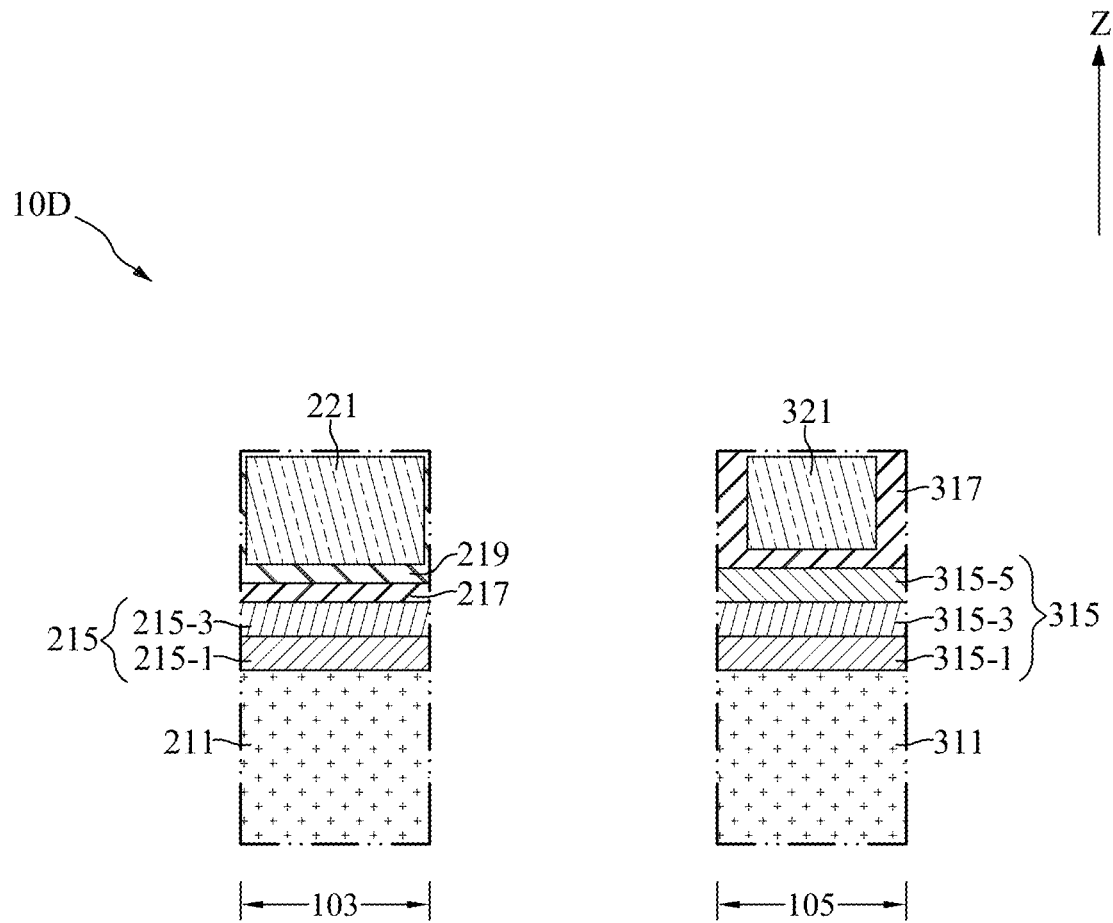
FIG. 6 illustrates, in a schematic enlarged cross-sectional view diagram, the semiconductor device in FIG. 5.
Figure 7:
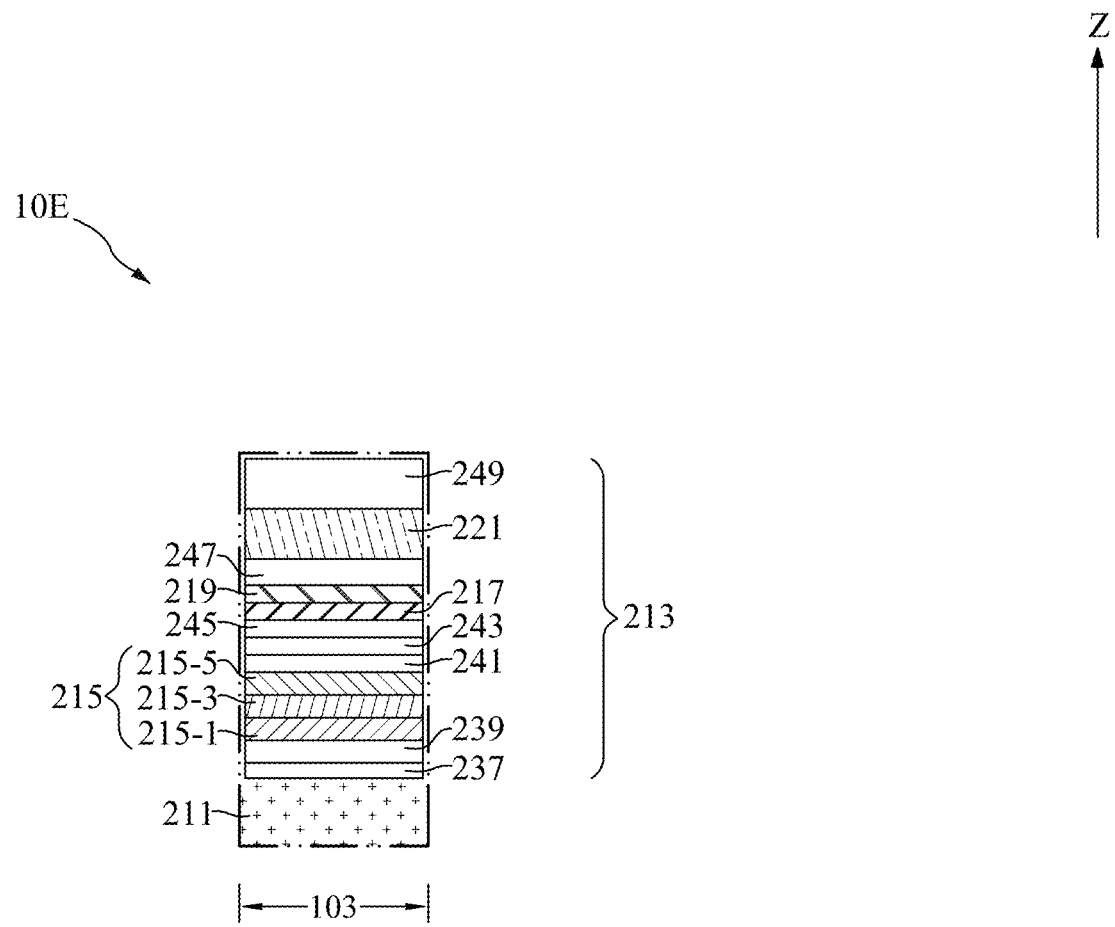
FIG. 7 illustrates, in a schematic enlarged cross-sectional view diagram, a semiconductor device in accordance with one embodiment of the present disclosure.
Figure 8:
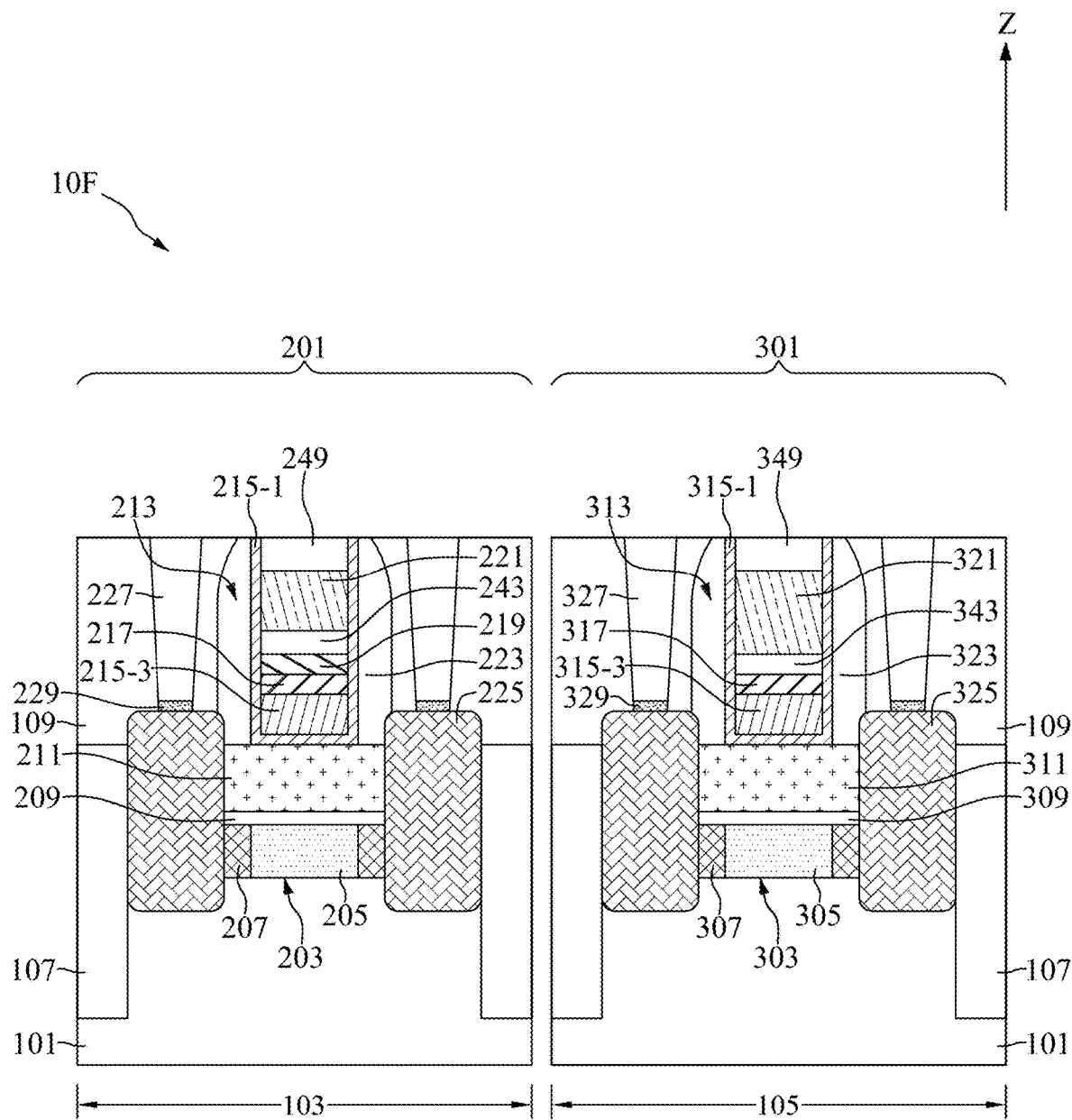
FIG. 8 illustrates, in a schematic cross-sectional diagram, a semiconductor device in accordance with one embodiment of the present disclosure.

FIGS. 3 to 5 illustrate, in schematic cross-sectional diagrams, semiconductor devices 10B, 10C, and 10D in accordance with embodiments of the present disclosure. FIG. 6 illustrates, in a schematic enlarged cross-sectional view diagram, the semiconductor device 10D in accordance with FIG. 5. FIG. 7 illustrates, in a schematic enlarged cross-sectional view diagram, a semiconductor device 10E in accordance with one embodiment of the present disclosure. FIG. 8 illustrates, in a schematic cross-sectional diagram, a semiconductor device 10F in accordance with one embodiment of the present disclosure.

With reference to FIG. 3, in the semiconductor device 10B, a first bottom insulating layer 233 may be disposed below the first bottom gate structure 203 and between the two first source/drain regions 225. The first bottom insulating layer 233 may be formed of a same material as the first bottom gate dielectric 209, but is not limited thereto. A first channel separation layer 231 may be disposed below the first bottom insulating layer 233 and between the two first source/drain regions 225. A bottom surface of the first channel separation layer 231 may be at a vertical level higher than the vertical level of the bottom surfaces of the two first source/drain regions 225. The first channel separation layer 231 may be doped with a dopant such as phosphorus, arsenic, antimony, or boron. The first channel separation layer 231 may have a second electrical type opposite to the electrical type of the two first source/drain regions 225.

With reference to FIG. 3, a second bottom insulating layer 333 may be disposed below the second bottom gate structure 303 and between the two second source/drain regions 325. The second bottom insulating layer 333 may be formed of a same material as the second bottom gate dielectric 309, but is not limited thereto. A second channel separation layer 331 may be disposed below the second bottom insulating layer 333 and between the two second source/drain regions 325. A bottom surface of the second channel separation layer 331 may be at a vertical level higher than the vertical level of the bottom surfaces of the two second source/drain regions 325. The second channel separation layer 331 may be doped with a dopant such as phosphorus, arsenic, antimony, or boron. The second channel separation layer 331 may have an electrical type opposite to the electrical type of the two second source/drain regions 325. The first channel separation layer 231 and the second channel separation layer 331 may prevent the formation of channels on the top surface of the substrate 101. Accordingly, a short channel effect may be prevented.

With reference to FIG. 4, in the semiconductor device 10C, a first buffer layer 235 may be disposed below the first bottom insulating layer 233. The bottom surface of the first buffer layer 235 may be at a vertical level lower than the vertical level of the bottom surfaces of the two first source/drain regions 225. The first buffer layer 235 may be formed of a material having a lattice constant different from that of the substrate 101. A second buffer layer 335 may be disposed below the second bottom insulating layer 333. The bottom surface of the second buffer layer 335 may be at a vertical level lower than the vertical level of the bottom surfaces of the two second source/drain regions 325. The second buffer layer 335 may be formed of a material having a lattice constant different from that of the substrate 101. The carrier mobility of the first transistor 201 or the carrier of the second transistor 301 may be increased due to the lattice constant inequality.

With reference to FIGS. 5 and 6, in the semiconductor device 10D, the thickness of the first top gate dielectric 215 may be less than the thickness of the second top gate dielectric 315. The first top gate dielectric 215 may include the first bottom sub-layer 215-1 and the first middle sub-layer 215-3. The first bottom work function layer 217 may be disposed on the first middle sub-layer 215-3.

With reference to FIGS. 5 and 6, the second top gate dielectric 315 may include the second bottom sub-layer 315-1, the second middle sub-layer 315-3, and a second top sub-layer 315-5. The second top sub-layer 315-5 may be disposed on the second middle sub-layer 315-3. The second top sub-layer 315-5 may have a U-shaped cross-sectional profile. The second top sub-layer 315-5 may have a thickness between about 0.5 nm and about 5.0 nm. Preferably, the thickness of the second top sub-layer 315-5 may be between about 0.5 nm and about 2.5 nm. It should be noted that the thickness of the second top sub-layer 315-5 may be set to an arbitrary range depending on the circumstances. In some embodiments, the second top sub-layer 315-5 may be formed of, for example, an insulating material having a dielectric constant of about 4.0 or greater. In some embodiments, the second top sub-layer 315-5 may be formed of, for example, silicon oxide, silicon nitride, silicon oxynitride, silicon nitride oxide, or the like. The second bottom work function layer 317 may be disposed on the second top sub-layer 315-5.

With reference to FIG. 7, in the semiconductor device 10E, the first top gate structure 213 may include a first interfacial layer 237, a first dipole layer 239, the first top gate dielectric 215, a first functional layer 241, a first adjustment layer 243, a first protection layer 245, the first bottom work function layer 217, the first top work function layer 219, a first encapsulation layer 247, the first filler layer 221, and a first capping layer 249. The first interfacial layer 237 may be disposed between the first channel layer 211 and the first top gate dielectric 215. The first interfacial layer 237 may facilitate formation of the first top gate dielectric 215. The first interfacial layer 237 may have a thickness between about 5 angstroms and about 20 angstroms. The first interfacial layer 237 may be formed of a chemical oxide of the underlying first channel layer 211, such as silicon oxide.

With reference to FIG. 7, the first dipole layer 239 may be disposed between the first top gate dielectric 215 and the first interfacial layer 237. The first dipole layer 239 may have a thickness less than 2 nm. The first dipole layer 239 may displace defects in the first top gate dielectric 215 and may improve the mobility and reliability of the first top gate structure 213. The first dipole layer 239 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide.

With reference to FIG. 7, the first functional layer 241 may be disposed on the first top gate dielectric 215. The first functional layer 241 may have a thickness between about 10 angstroms and about 15 angstroms and may be formed of, for example, titanium nitride or tantalum nitride. The first functional layer 241 may protect first top gate dielectric 215 from damage during subsequent semiconductor processes. The first adjustment layer 243 may be disposed on the first functional layer 241 and may include a material or an alloy including lanthanide nitride. The first adjustment layer 243 may be used to fine-tune the threshold voltage of the first top gate structure 213. The first protection layer 245 may be disposed on the first adjustment layer 243 and may protect the first adjustment layer 243 from damage during subsequent semiconductor processes. The first protection layer 245 may be formed of, for example, titanium nitride.

With reference to FIG. 7, the first encapsulation layer 247 may be disposed below the first filler layer 221. The first encapsulation layer 247 may have a thickness between about 15 angstroms and about 25 angstroms. The first encapsulation layer 247 may be formed of, for example, titanium nitride. The first encapsulation layer 247 may protect layers below the first encapsulation layer 247 from mechanical damage or diffusion of the first filler layer 221. The first capping layer 249 may be disposed on the first filler layer 221. The first capping layer 249 may be formed of, for example, silicon oxide, silicon nitride, silicon oxynitride, silicon nitride oxide, or fluoride-doped silicate.

With reference to FIG. 8, in the semiconductor device 10F, the first top gate structure 213 may be disposed on the first channel layer 211 and may include the first bottom sub-layer 215-1, the first middle sub-layer 215-3, the first bottom work function layer 217, the first top work function layer 219, the first adjustment layer 243, the first filler layer 221, the first capping layer 249, and the two first top gate spacers 223. The first bottom sub-layer 215-1 may be disposed on the first channel layer 211 and may have a U-shaped cross-sectional profile. The first middle sub-layer 215-3 may be disposed on the first bottom sub-layer 215-1. The U-shaped cross-sectional profile of the first bottom sub-layer 215-1 may be regarded as a recessed space. The first middle sub-layer 215-3 may be disposed in a lower portion of the recessed space. The first bottom work function layer 217 may be disposed on the first middle sub-layer 215-3. The first top work function layer 219 may be disposed on the first bottom work function layer 217. The first adjustment layer 243 may be disposed on the first top work function layer 219. The first filler layer 221 may be disposed on the first adjustment layer 243. The first capping layer 249 may be disposed on the first filler layer 221.

With reference to FIG. 8, the second top gate structure 313 may be disposed on the second channel layer 311 and may include the second bottom sub-layer 315-1, the second middle sub-layer 315-3, the second bottom work function layer 317, the second adjustment layer 343, the second filler layer 321, the second capping layer 349, and the two second top gate spacers 323. The second bottom sub-layer 315-1 may be disposed on the second channel layer 311 and may have a U-shaped cross-sectional profile. The second middle sub-layer 315-3 may be disposed on the second bottom sub-layer 315-1. The U-shaped cross-sectional profile of the second bottom sub-layer 315-1 may be regarded as a recessed space. The second middle sub-layer 315-3 may be disposed in a lower portion of the recessed space. The second bottom work function layer 317 may be disposed on the second middle sub-layer 315-3. The second adjustment layer 343 may be disposed on the second bottom work function layer 317. The second filler layer 321 may be disposed on the second adjustment layer 343. The second capping layer 349 may be disposed on the second filler layer 321.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 9:
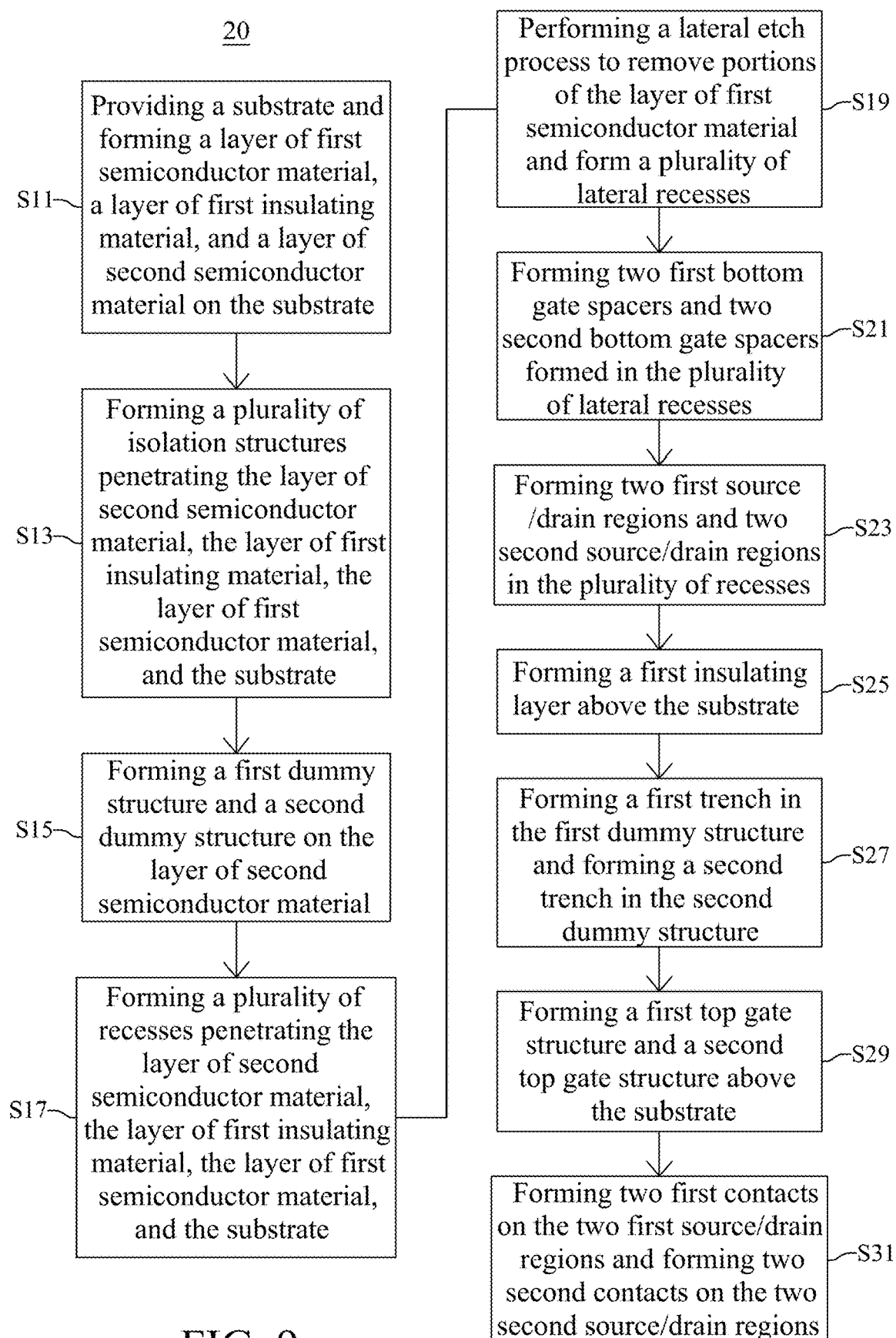
FIG. 9 illustrates, in a flowchart diagram form, a method for fabricating a semiconductor device in accordance with one embodiment of the present disclosure.

FIG. 9 illustrates, in a flowchart diagram form, a method 20 for fabricating a semiconductor device 10A in accordance with one embodiment of the present disclosure. FIGS. 10 to 26 illustrate, in schematic cross-sectional view diagrams, a flow for fabricating the semiconductor device 10A in accordance with one embodiment of the present disclosure.

Figure 10:
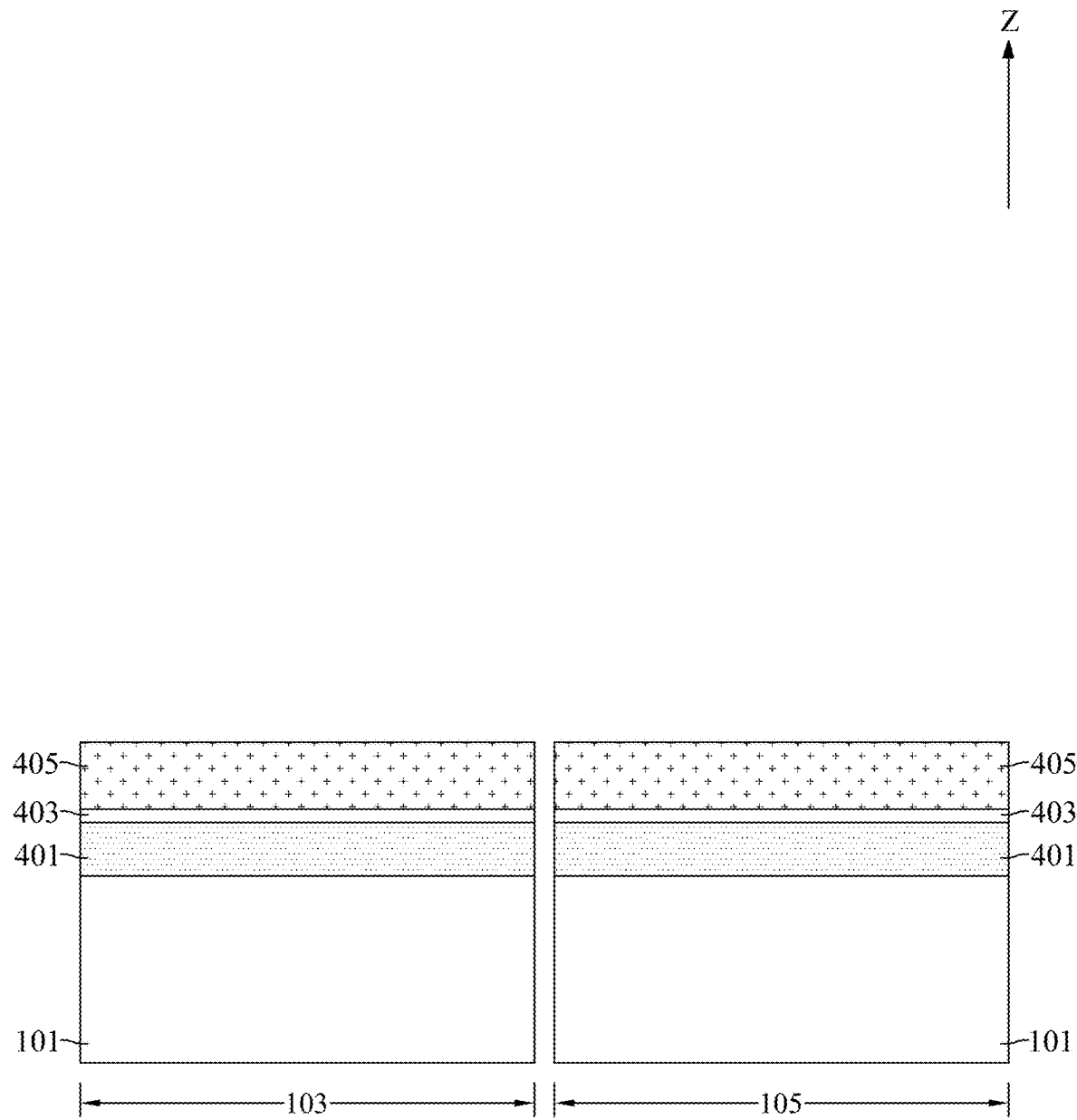
FIGS. 10 to 26 illustrate, in schematic cross-sectional view diagrams, a flow for fabricating the semiconductor device in accordance with one embodiment of the present disclosure.

With reference to FIGS. 9 and 10, at step S11, a substrate 101 may be provided and a layer of first semiconductor material 401, a layer of first insulating material 403, and a layer of second semiconductor material 405 may be sequentially formed on the substrate 101. The substrate 101 may include a first region 103 and a second region 105. The first region 103 and the second region 105 may be adjacent to each other. In some embodiments, the first region 103 and the second region 105 may be separated from each other.

In some embodiments, the first semiconductor material 401 may be, for example, a conductive material such as polycrystalline silicon, polycrystalline silicon germanium, or a combination thereof. Dopants such as phosphorus, arsenic, antimony, or boron may be doped into the layer of first semiconductor material 401 during the formation of the layer of first semiconductor material 401. In some embodiments, the first semiconductor material 401 may be, for example, tungsten, aluminum, titanium, copper, tantalum, molybdenum, tantalum nitride, nickel silicide, cobalt silicide, titanium nitride, tungsten nitride, titanium aluminide, titanium aluminum nitride, tantalum carbon nitride, tantalum carbide, tantalum silicon nitride, or a combination thereof.

In some embodiments, the first insulating material 403 may be, for example, silicon oxide or the like. In some embodiments, the first insulating material 403 may be, for example, an insulating material having a dielectric constant of about 4.0 or greater. In some embodiments, the second semiconductor material 405 may include IV, II-IV or III-V compounds such as silicon, germanium, silicon germanium, indium gallium arsenide, indium arsenide, gallium antimonide, or indium antimonide.

Figure 11:
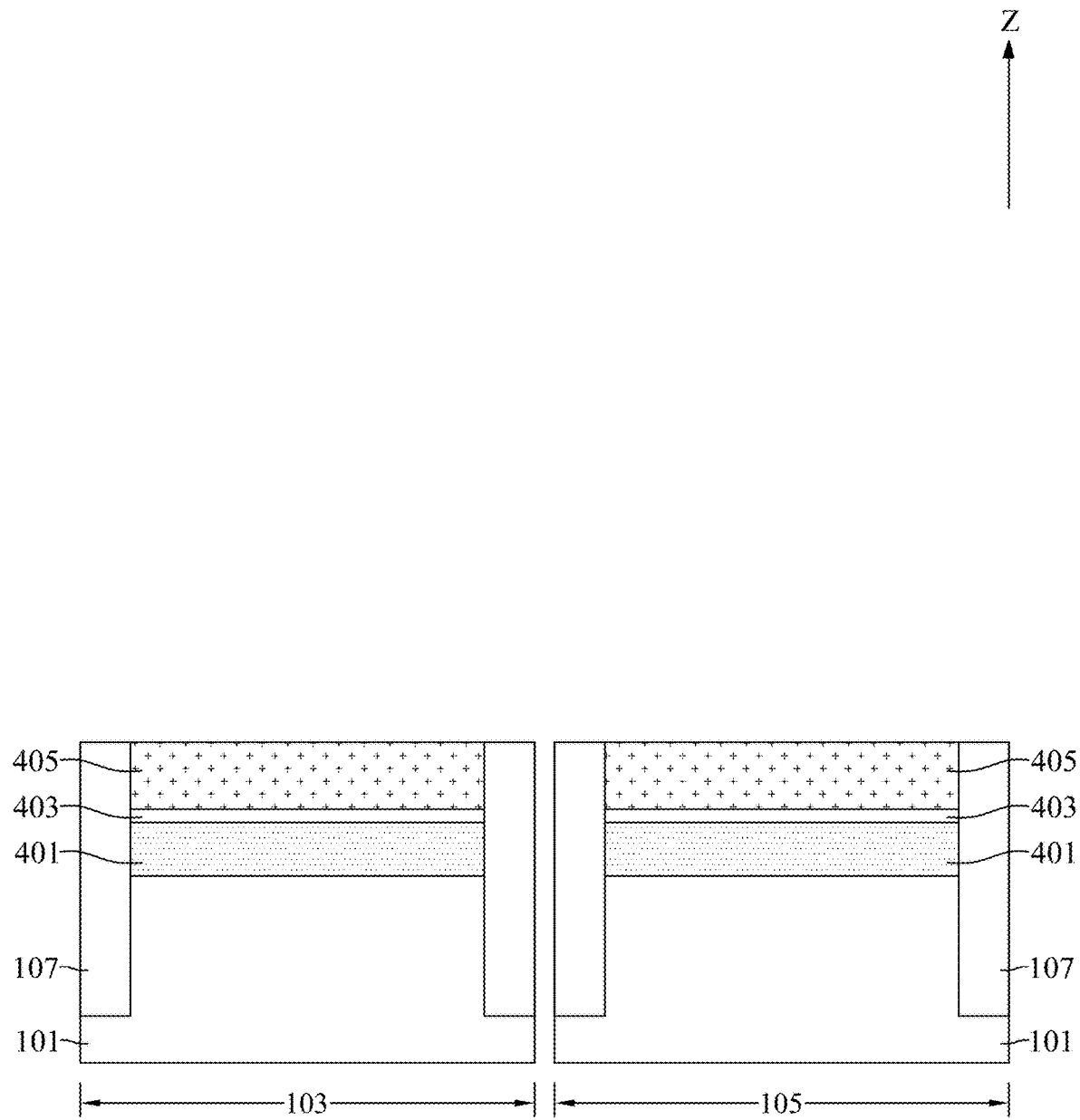

With reference to FIGS. 9 and 11, at step S13, a plurality of isolation structures 107 may be formed so as to penetrate the layer of second semiconductor material 405, the layer of first insulating material 403, the layer of first semiconductor material 401, and the substrate 101. With reference to FIG. 11, a series of deposition processes may be performed to deposit a pad oxide layer (not shown in FIG. 11) and a pad nitride layer (not shown in FIG. 11) on the layer of second semiconductor material 405. A photolithography process may be performed to define positions of the plurality of isolation structures 107. After the photolithography process, an etch process, such as an anisotropic dry etch process, may be performed to form trenches penetrating through the pad oxide layer, the pad nitride layer, and the substrate 101. An insulating material may be deposited in the trenches and a planarization process, such as chemical mechanical polishing, may be subsequently performed to remove excess filling material until the layer of second semiconductor material 405 is exposed and the plurality of isolation structures 107 are concurrently formed. The insulating material may be, for example, silicon oxide, silicon nitride, silicon oxynitride, silicon nitride oxide, or fluoride-doped silicate.

Figure 12:
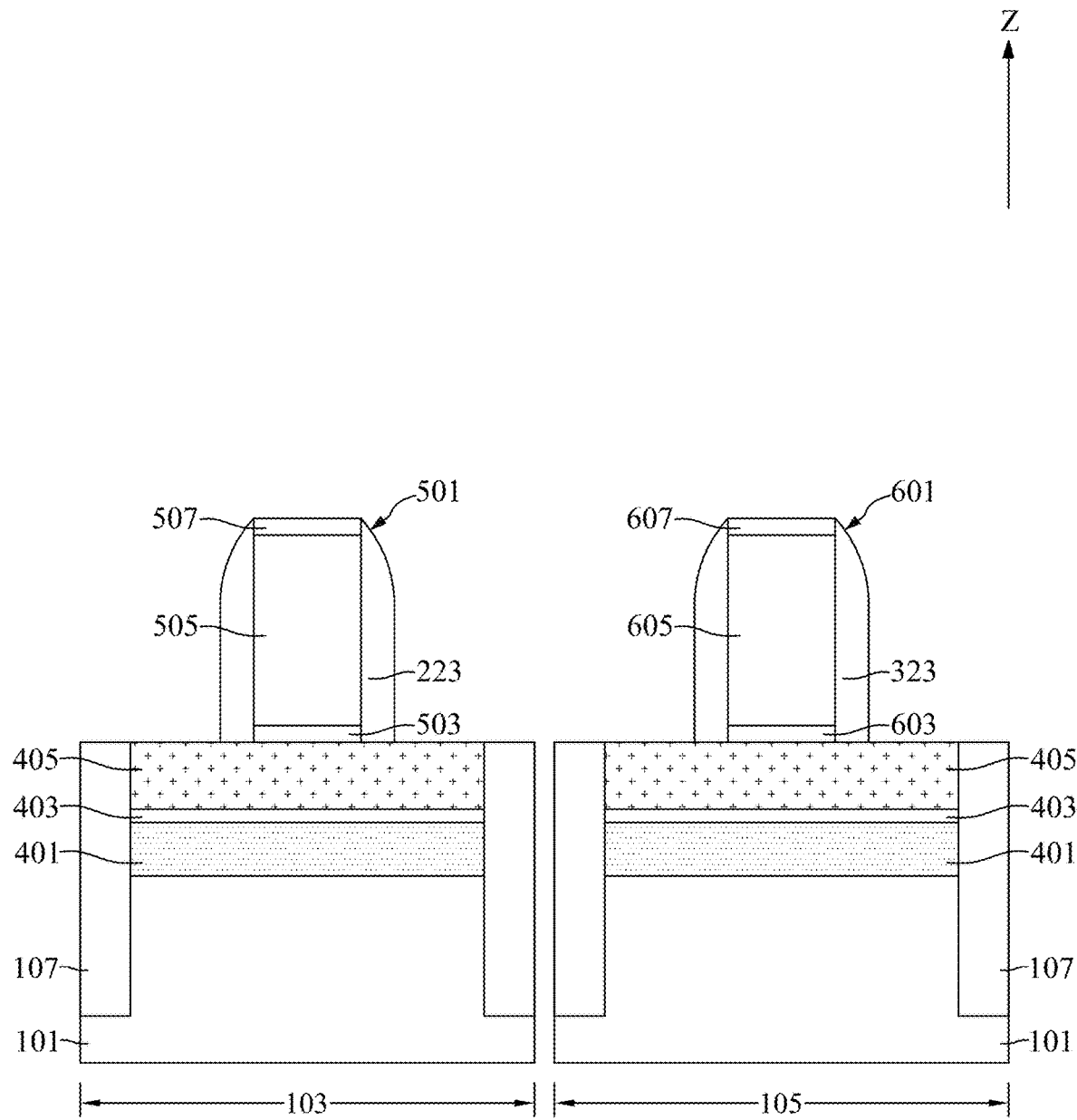

With reference to FIGS. 9 and 12, at step S15, a first dummy structure 501 and a second dummy structure 601 may be formed on the layer of second semiconductor material 405. The first dummy structure 501 may be formed in the first region 103 and may include a first bottom dummy layer 503, a first middle dummy layer 505, a first top dummy layer 507, and two first top gate spacers 223. The second dummy structure 601 may be formed in the second region 105 and may include a second bottom dummy layer 603, a second middle dummy layer 605, a second top dummy layer 607, and two second top gate spacers 323.

With reference to FIG. 12, an etch stop layer, a sacrificial layer, and a mask layer may be sequentially deposited over the layer of second semiconductor material 405 and the plurality of isolation structures 107. The etch stop layer may be formed of, for example, carbon-doped oxide, carbon incorporated silicon oxide, ornithine decarboxylase, or nitrogen-doped silicon carbide. The sacrificial layer may be formed of, for example, polysilicon. The mask layer may be formed of, for example, silicon oxide, silicon nitride, or the like. A photolithography process may be performed to define positions of the first dummy structure 501 and the second dummy structure 601. After the photolithography process, an etch process, such as an anisotropic dry etch process, may be performed to remove portions of the etch stop layer, the sacrificial layer, and the mask layer. Concurrently, the first bottom dummy layer 503, the first middle dummy layer 505, the first top dummy layer 507, the second bottom dummy layer 603, the second middle dummy layer 605, the second top dummy layer 607 may be formed after the etch process.

With reference to FIG. 12, a spacer insulating layer may be deposited over the intermediate semiconductor device. An etch process, such as an anisotropic dry etch process, may be performed to remove portions of the spacer insulating layer and concurrently form the two first top gate spacers 223 and the two second top gate spacers 323. The spacer insulating layer may be, for example, silicon oxide, silicon nitride, or the like.

Figure 13:
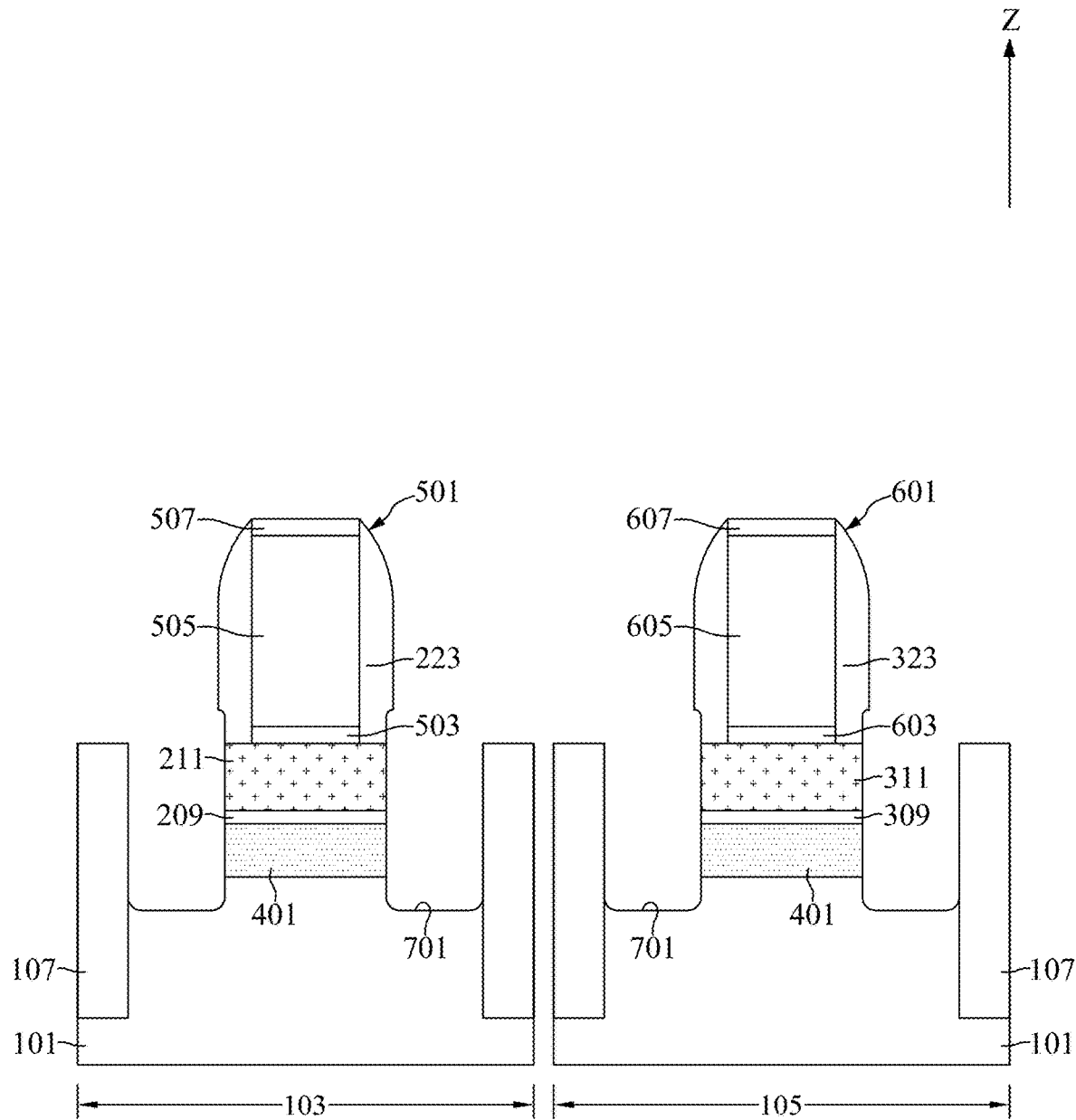

With reference to FIGS. 9 and 13, at step S17, a plurality of recesses 701 may be formed so as to penetrate the layer of second semiconductor material 405, the layer of first insulating material 403, the layer of first semiconductor material 401, and the substrate 101. An etch process, such as an anisotropic dry etch process, using the first dummy structure 501 and the second dummy structure 601 as masks, may be performed to remove portions of the layer of second semiconductor material 405, the layer of first insulating material 403, the layer of first semiconductor material 401, and the substrate 101 and concurrently form the plurality of recesses 701. After the etch process, the layer of second semiconductor material 405 may be turned into the first channel layer 211 and the second channel layer 311. The layer of first insulating material 403 may be turned into the first bottom gate dielectric 209 and the second bottom gate dielectric 309. The etch process may include multiple steps and use various etchants.

Figure 14:
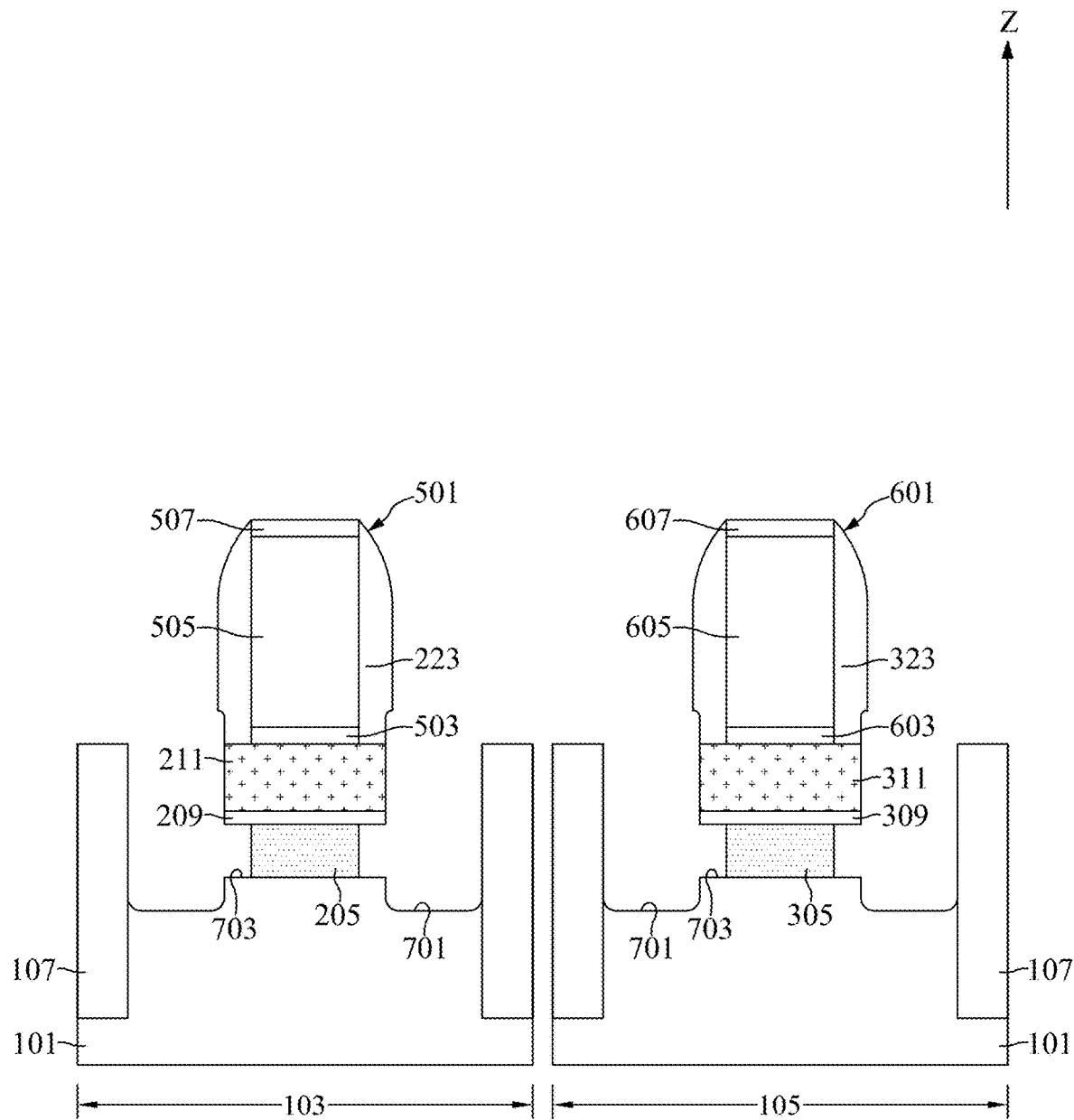

With reference to FIGS. 9 and 14, at step S19, a lateral etch process may be performed to remove portions of the layer of first semiconductor material 401 and form a plurality of lateral recesses 703. The lateral etch process may have an etching selectivity with respect to the first semiconductor material 401. The selectivity of an etch process may be generally expressed as a ratio of etching rates. For example, if one material is etched 25 times faster than another material, the etch process may be described as having a selectivity of 25:1 or simply 25. In this regard, higher ratios or values indicate more selective etching processes. In the lateral etch process, an etching rate for the first semiconductor material 401 may be greater than an etching rate of the 101, an etching rate of the first insulating material 403, an etching rate of the second semiconductor material 405, and an etching rate of the plurality of isolation structures 107. The selectivity of the lateral etch process may be greater than or equal to about 10, greater than or equal to about 12, greater than or equal to about 15, greater than or equal to about 20, or greater than or equal to about 25.

Figure 15:
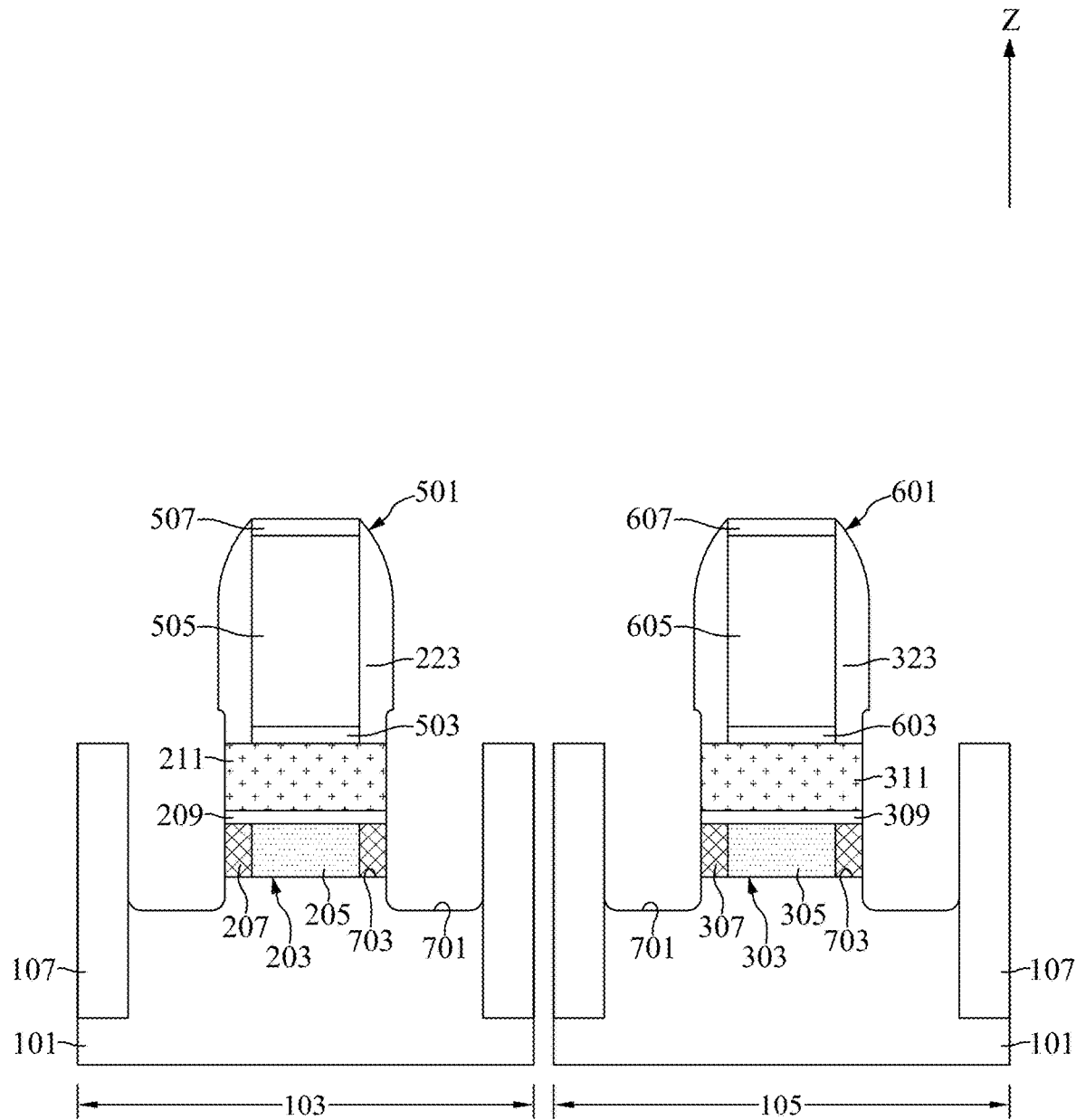

With reference to FIGS. 9 and 15, at step S21, two first bottom gate spacers 207 and two second bottom gate spacers 307 may be formed in the plurality of lateral recesses 703. An insulating material or an energy material may be deposited to fill the plurality of lateral recesses 703 and portions of the plurality of recesses 701. The insulating material may be silicon oxide, silicon nitride, silicon oxynitride, silicon nitride oxide, or the like. An etch back process may be performed to remove the filling material in the plurality of recesses 701 and concurrently form the two first bottom gate spacers 207 and the two second bottom gate spacers 307 in the plurality of lateral recesses 703.

Figure 16:
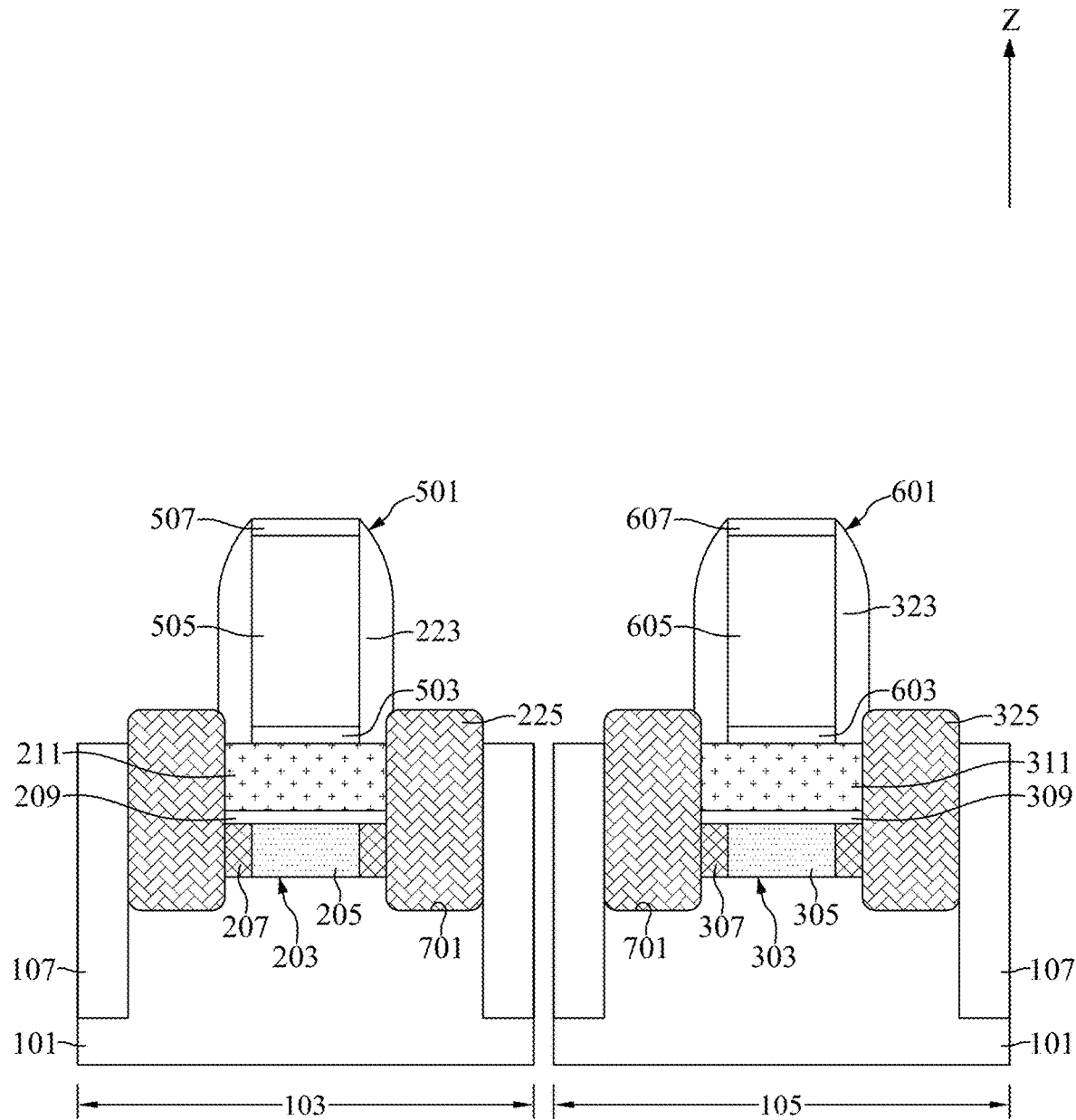

With reference to FIGS. 9 and 16, at step S23, two first source/drain regions 225 and two second source/drain regions 325 may be formed in the plurality of recesses 701. The two first source/drain regions 225 and the two second source/drain regions 325 may be concurrently formed in the plurality of recesses 701 using an epitaxy growth process. In some embodiments, the two first source/drain regions 225 and the two second source/drain regions 325 may be formed separately using suitable masks.

Figure 17:
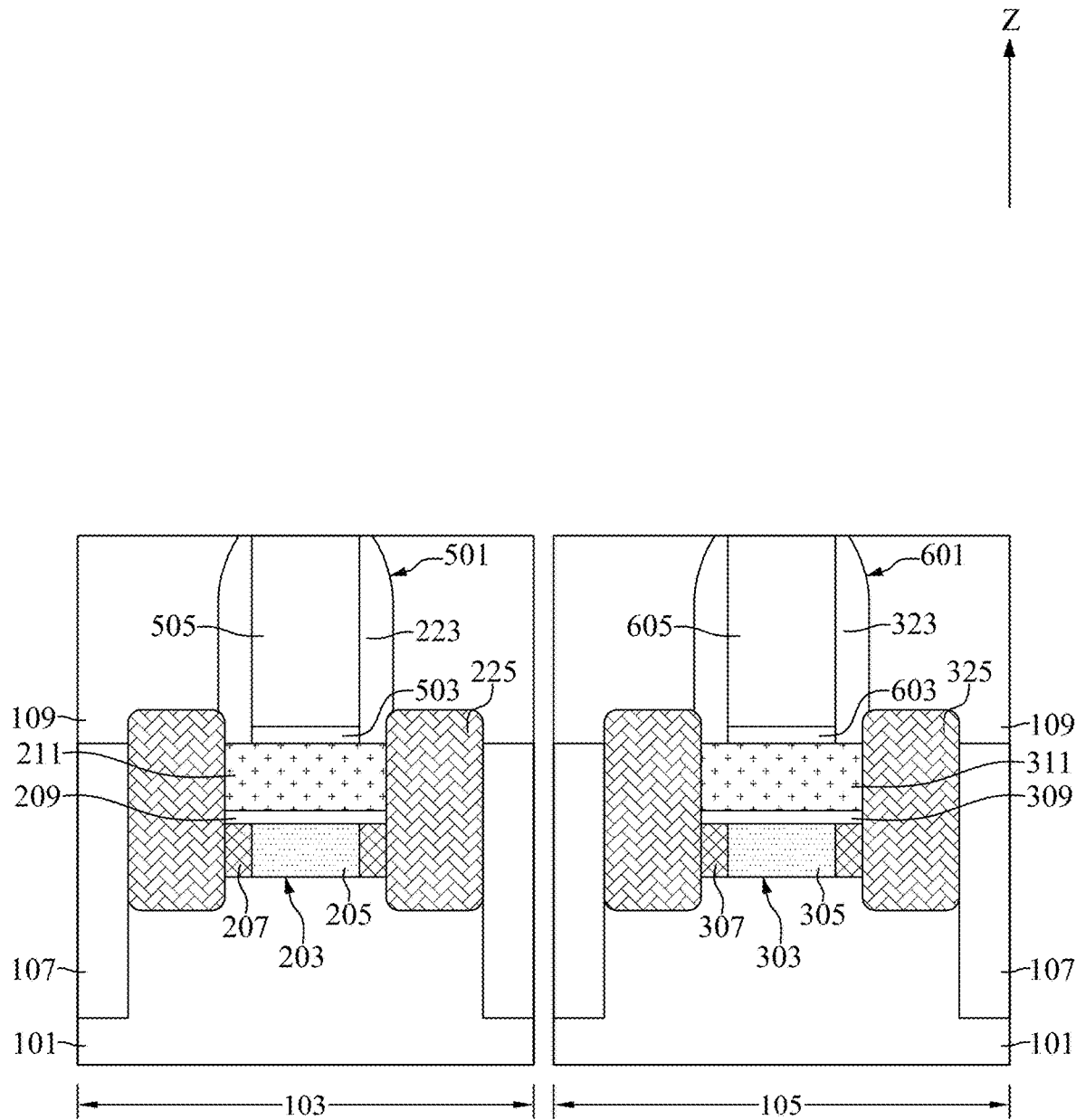

With reference to FIGS. 9 and 17, at step S25, a first insulating layer 109 may be formed above the substrate 101. The first insulating layer 109 may be formed over the intermediate semiconductor device. A planarization process, such as chemical mechanical polishing, may be performed, until the top surface of the first middle dummy layer 505 and the top surface of the second middle dummy layer 605 are exposed, to provide a substantially flat surface for subsequent processing steps.

Figure 18:
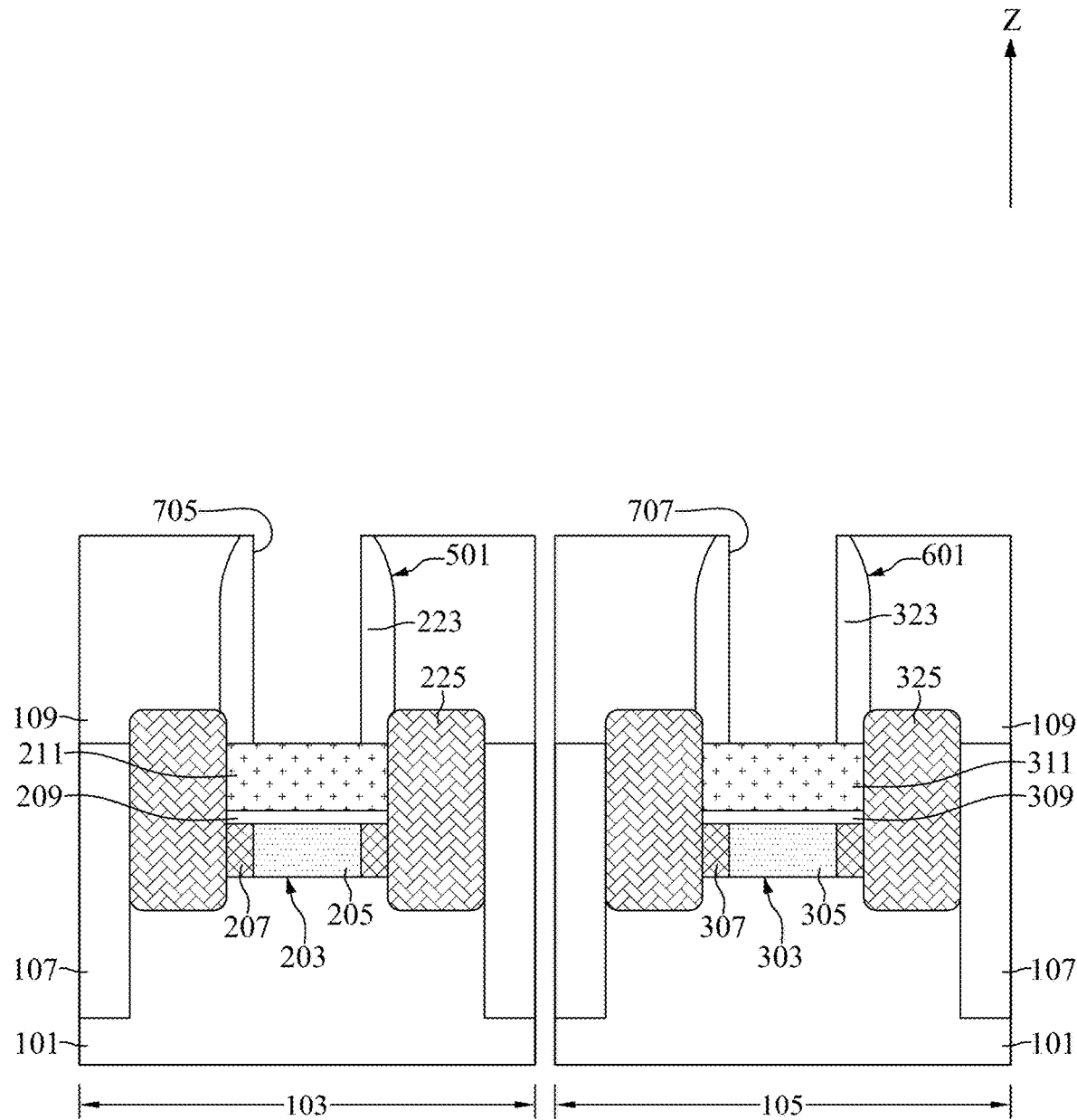

With reference to FIGS. 9 and 18, at step S27, a first trench 705 may be formed in the first dummy structure 501 and a second trench 707 may be formed in the second dummy structure 601. An etch process, such as an anisotropic dry etch process, may be performed to remove the first middle dummy layer 505, the first bottom dummy layer 503, the second middle dummy layer 605, and the second bottom dummy layer 603 and concurrently form the first trench 705 and the second trench 707 in the appropriate positions. A portion of the top surface of the first channel layer 211 may be exposed through the first trench 705. A portion of the top surface of the second channel layer 311 may be exposed through the second trench 707.

Figure 19:
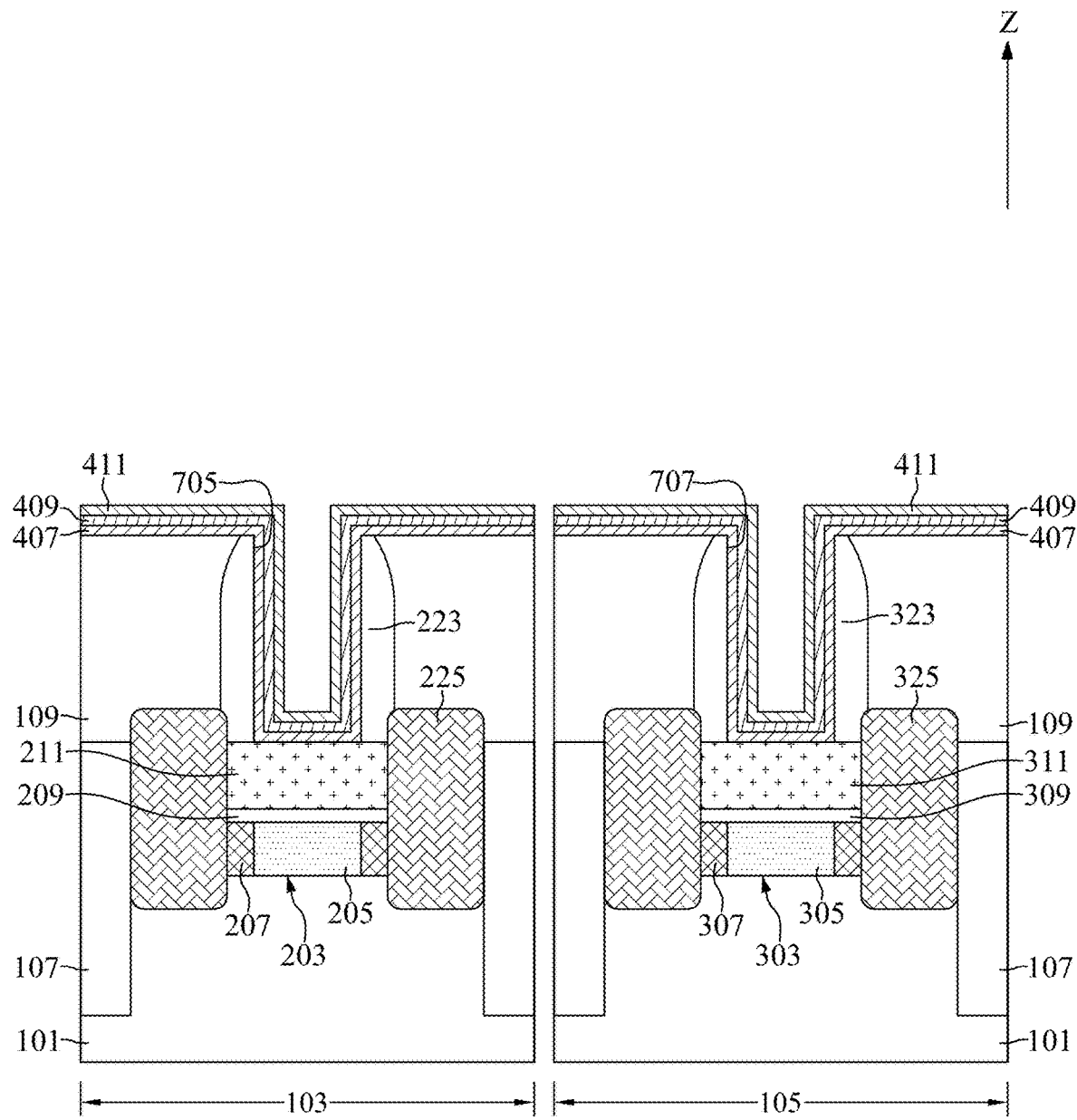

With reference to FIG. 9 and FIGS. 19 to 24, at step S29, a first top gate structure 213 and a second top gate structure 313 may be formed above the substrate 101. With reference to FIG. 19, a layer of third insulating material 407, a layer of fourth insulating material 409, and a layer of fifth insulating material 411 may be formed on the first insulating layer 109 and in the first trench 705 and the second trench 707. The third insulating material 407 may be, for example, silicon oxide, silicon nitride, silicon oxynitride, silicon nitride oxide, or the like. The fourth insulating material 409 may be, for example, an insulating material having a dielectric constant of about 4.0 or greater. The fifth insulating material 411 may be, for example, silicon oxide, silicon nitride, silicon oxynitride, silicon nitride oxide, or the like.

Figure 20:
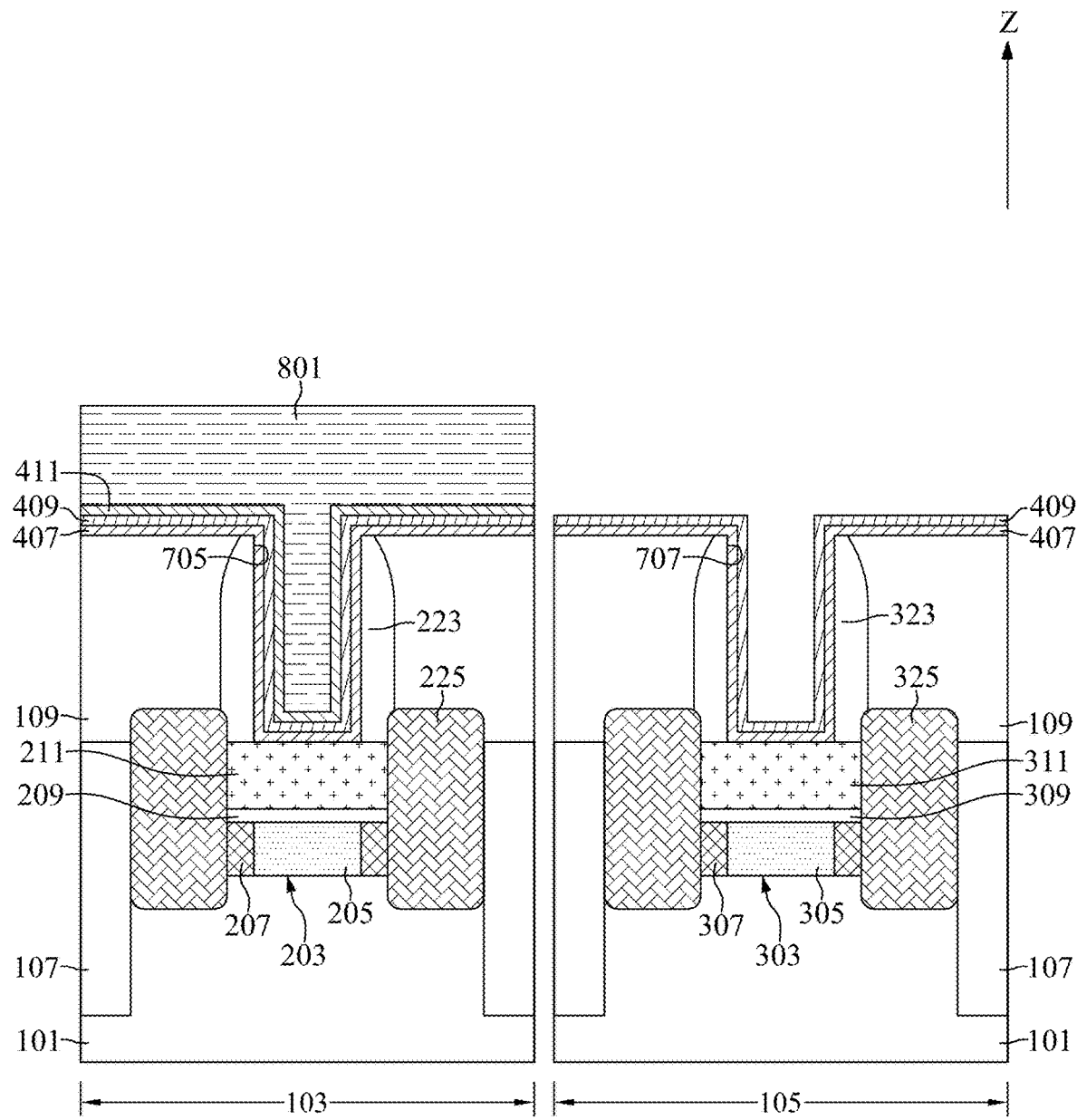
Figure 21:
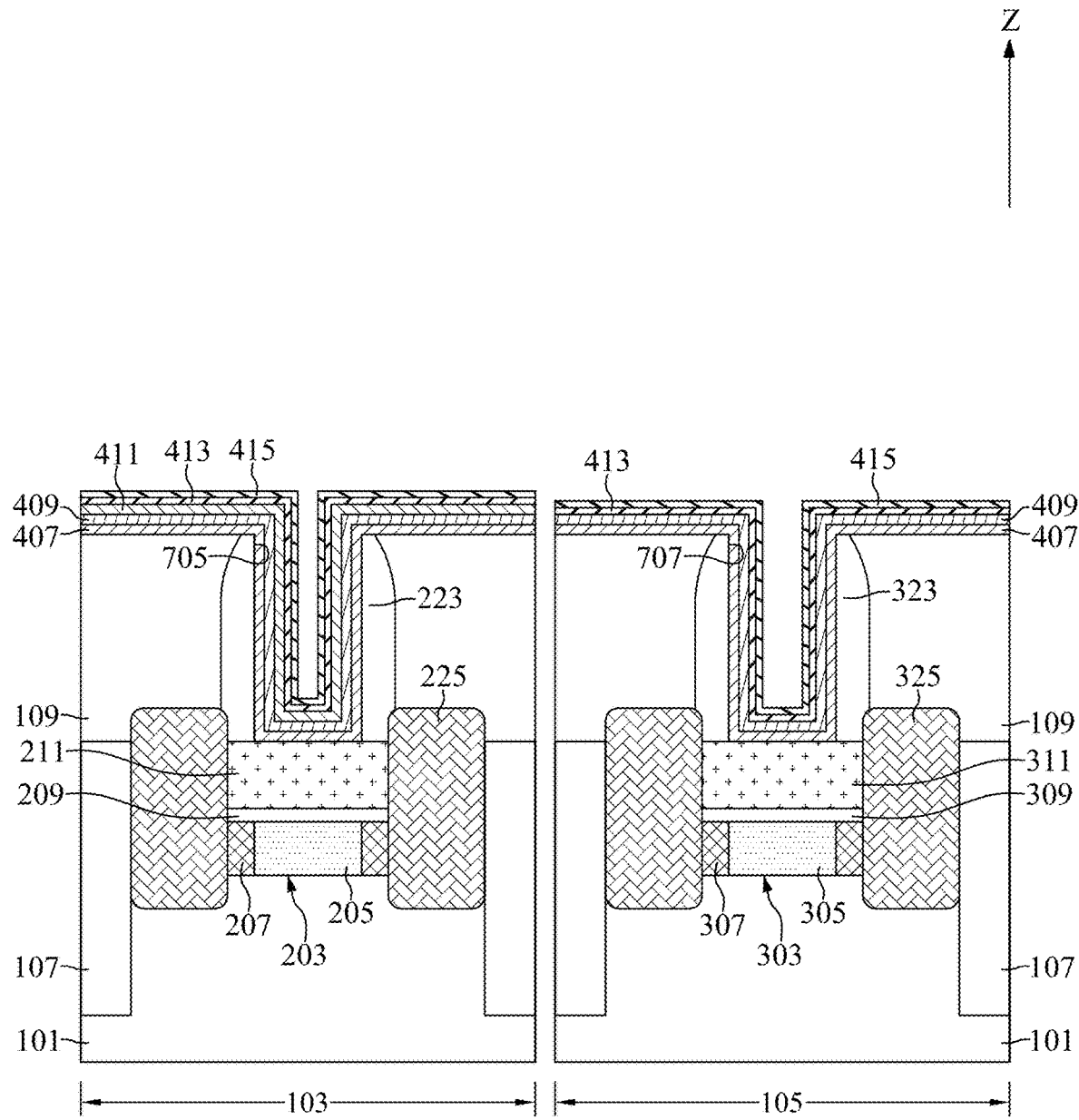

With reference to FIG. 20, a first mask layer 801 may be formed to mask the first region 103. The layer of fifth insulating material 411 formed within the second region 105 may be removed by an etch process. After the etch process, the first mask layer 801 may be removed. With reference to FIG. 21, a layer of bottom work function material 413 and a layer of top work function material 415 may be sequentially formed over the layer of fifth insulating material 411 and over the layer of fourth insulating material 409. The bottom work function material 413 may be, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The top work function material 415 may be, for example, titanium nitride, tantalum nitride, tantalum carbide, tungsten nitride, or ruthenium.

Figure 22:
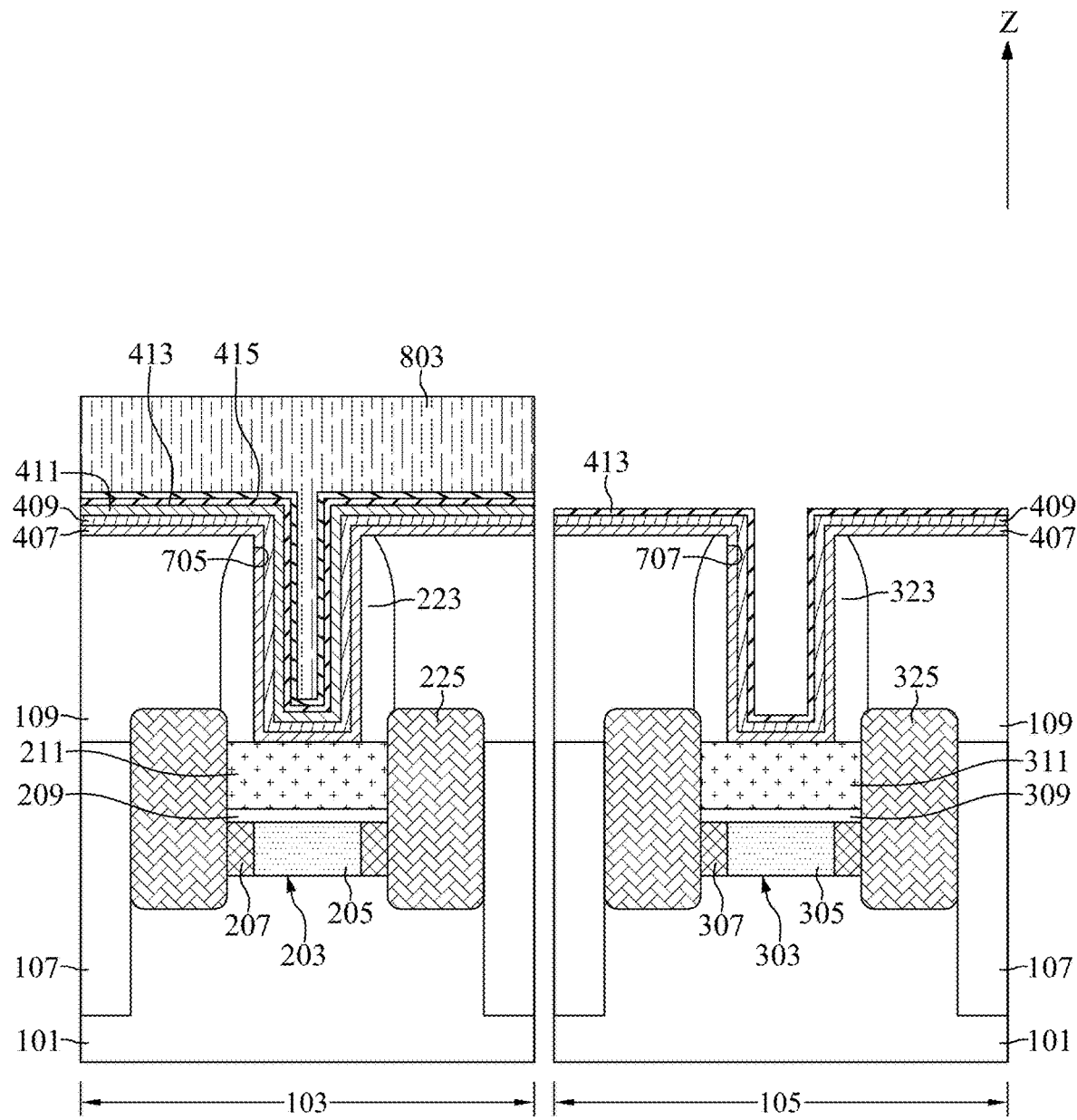
Figure 23:
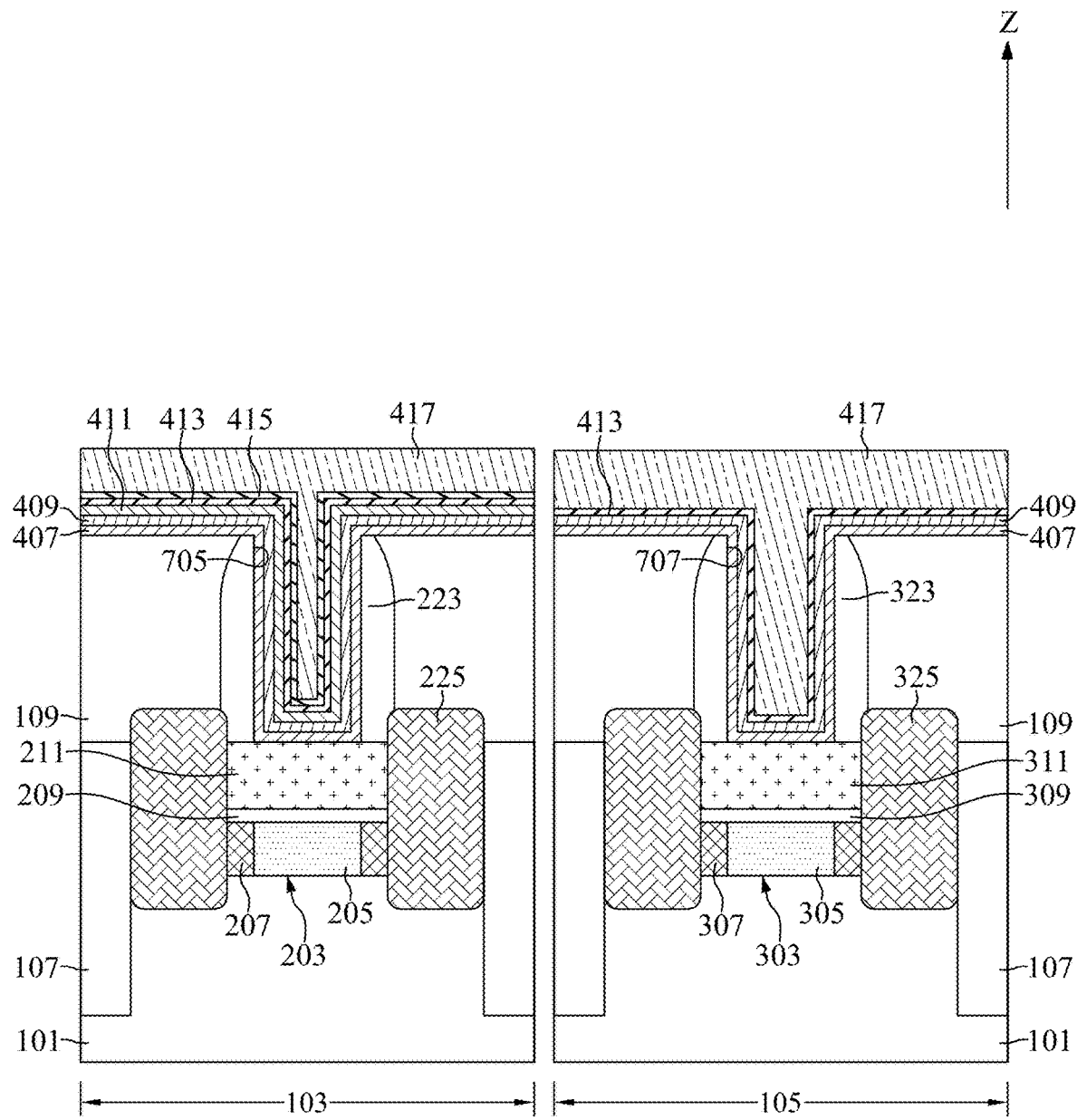
Figure 24:
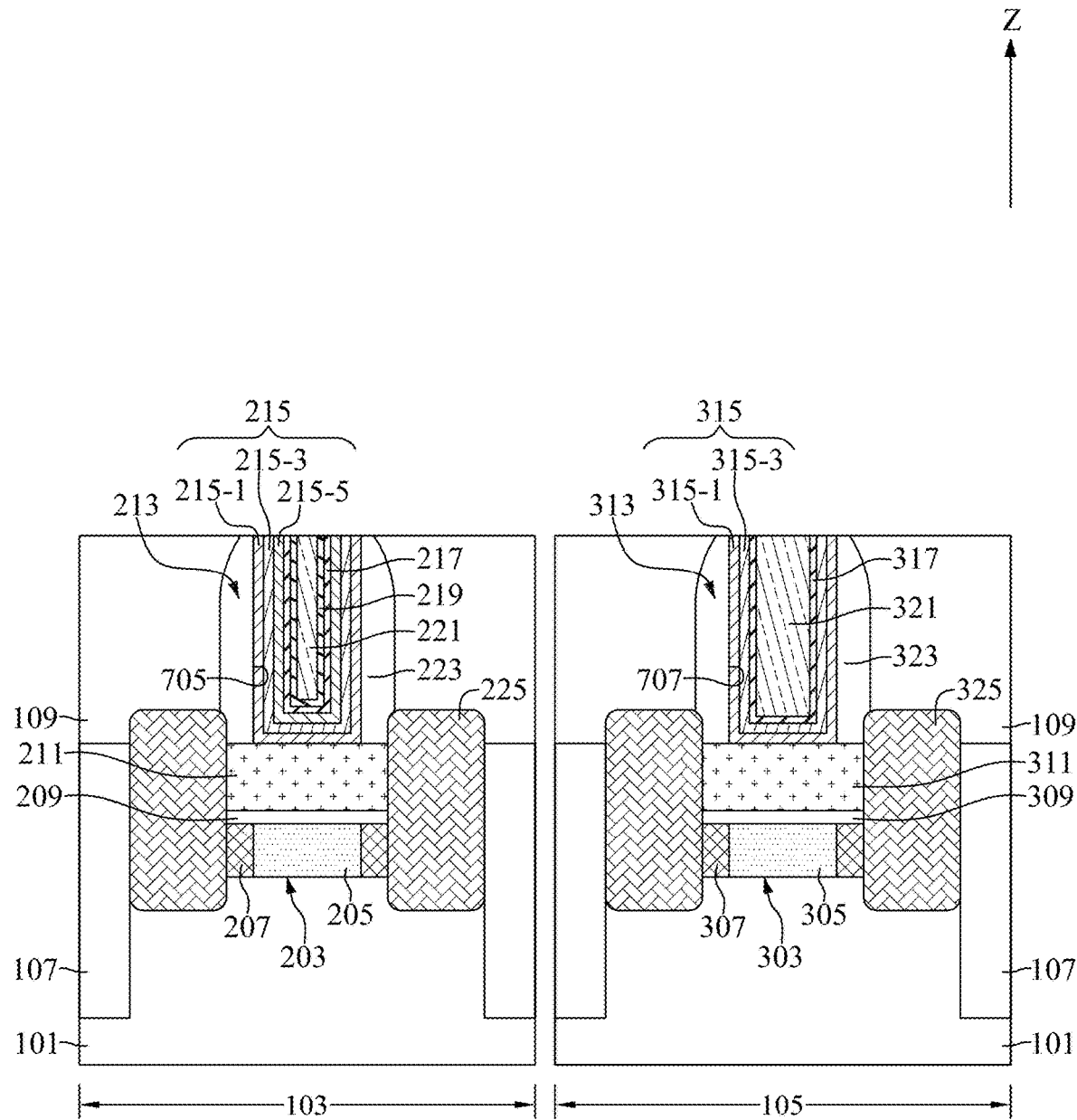

With reference to FIG. 22, a second mask layer 803 may be formed to mask the first region 103. The layer of top work function material 415 formed within the second region 105 may be removed by an etch process. After the etch process, the second mask layer 803 may be removed. With reference to FIG. 23, a layer of filler material 417 may be formed over the layer of bottom work function material 413 and the layer of top work function material 415 and deposited to completely fill the first trench 705 and the second trench 707. With reference to FIG. 24, a planarization process, such as chemical mechanical polishing, may be performed, until the top surface of the first insulating layer 109 is exposed, to remove excess material, provide a substantially flat surface for subsequent processing steps, and conformally form the first top gate structure 213 and the second top gate structure 313.

Figure 25:
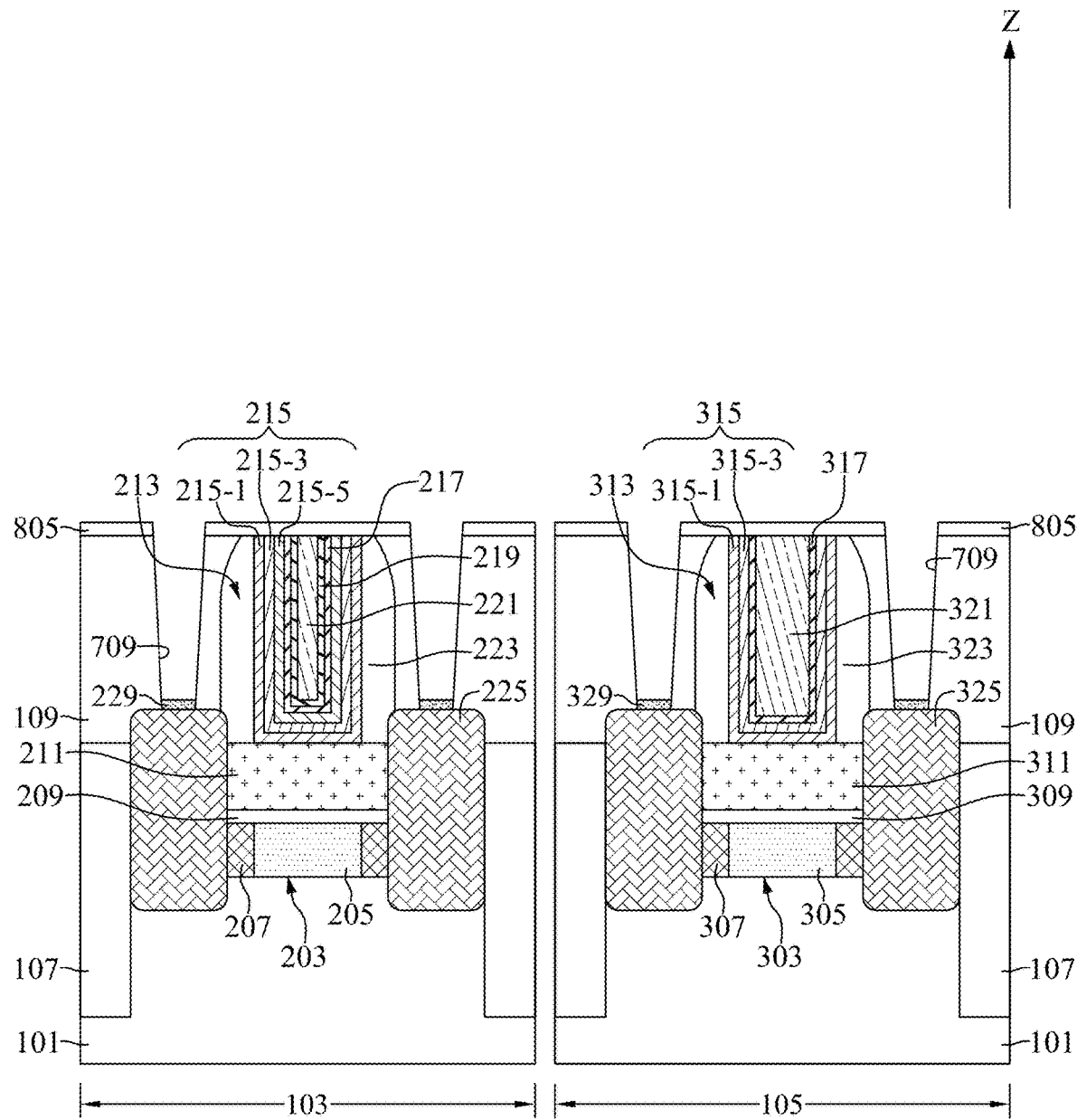
Figure 26:
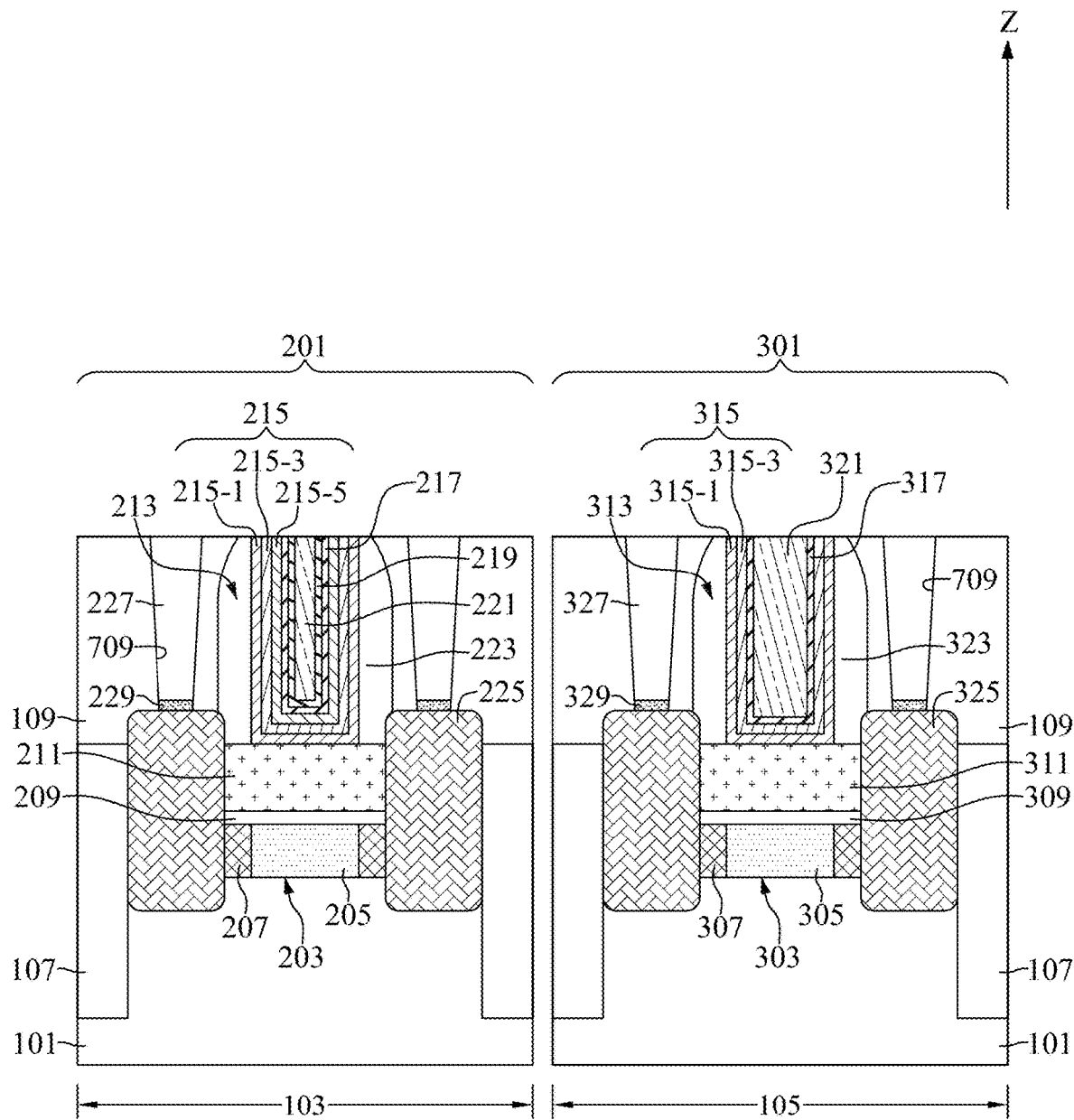

With reference to FIGS. 9, 25, and 26, at step S31, two first contacts 227 may be formed on the two first source/drain regions 225 and two second contacts 327 may be formed on the two second source/drain regions 325. With reference to FIG. 25, a second insulating layer 805 may be formed on the first insulating layer 109. The second insulating layer 805 may be formed of a same material as the first insulating layer 109, but is not limited thereto. A photolithography process may be performed to define positions of the two first contacts 227 and the two second contacts 327. After the photolithography process, an etch process, such as an anisotropic dry etch process, may be performed to remove portions of the second insulating layer 805 and the first insulating layer 109, and conformally form a plurality of contact openings 709. Portions of the top surfaces of the two first source/drain regions 225 and the two second source/drain regions 325 may be exposed through the plurality of contact openings 709.

With reference to FIG. 25, a layer of metal may be subsequently deposited into the plurality of contact openings 709. The metal may include, for example, titanium, nickel, platinum, tantalum, or cobalt. A thermal treatment may be performed. During the thermal treatment, metal atoms of the layer of metal may react chemically with silicon atoms of the two first source/drain regions 225 and the two second source/drain regions 325 to form the two first conductive layers 229 and the two second conductive layers 329, respectively. The thermal treatment may be a dynamic surface annealing process. After the thermal treatment, a cleaning process may be performed to remove the unreacted metal. The cleaning process may use etchant such as hydrogen peroxide and an SC-1 solution.

With reference to FIG. 26, a conductive material such as doped polysilicon, metal, or metal nitride may be deposited into the plurality of contact openings 709 by a deposition process. After the deposition process, a planarization process, such as chemical mechanical polishing, may be performed, until the top surface of the first insulating layer 109 is exposed, to remove excess material, provide a substantially flat surface for subsequent processing steps, and conformally form the two first contacts 227 and the two second contacts 327. In some embodiments, the planarization process may be performed until the top surface of the second insulating layer 805 is exposed. That is, the second insulating layer 805 may remain in place and may serve as a capping layer for the first top gate structure 213 and the second top gate structure 313 to protect the first top gate structure 213 and the second top gate structure 313 from damage during subsequent semiconductor processes.

One aspect of the present disclosure provides a semiconductor device including a substrate including a first region, and a first transistor positioned in the first region. The first transistor includes a first bottom gate structure positioned on the substrate, a first channel layer positioned on the first bottom gate structure, a first top gate structure positioned on the first channel layer, and two first source/drain regions positioned on two sides of the first channel layer.

Another aspect of the present disclosure provides a method for fabricating a semiconductor device including providing a substrate, forming a first bottom gate structure on the substrate, forming a first channel layer on the first bottom gate structure, forming a first top gate structure on the first channel layer, and forming two first source/drain regions on two sides of the first channel layer.

Due to the design of the semiconductor device of the present disclosure, the conductive status of the first channel layer may be control by both the first bottom gate structure and the first top gate structure. As a result, the leakage current in the first channel layer may be reduced. In addition, the first top gate dielectric and the second top gate dielectric, which have different thicknesses, may have different threshold voltages and may provide different functions; therefore, the applicability of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising a first region and a second region adjacent to the first region;
a first transistor positioned in the first region; and
a second transistor position in the second region;
wherein the first transistor comprises a first bottom gate structure positioned on the substrate, a first channel layer positioned on the first bottom gate structure, a first top gate structure positioned on the first channel layer, and two first source/drain regions positioned on two sides of the first channel layer;
wherein the second transistor comprises a second bottom gate structure positioned on the substrate, a second channel layer positioned on the second bottom gate structure, and a second top gate structure positioned on the second channel layer;
wherein the first top gate structure comprises a first top gate dielectric positioned on the first channel layer, a first filler layer positioned on the first top gate dielectric and two first top gate spacers positioned on two sides of the first top gate dielectric, the second top gate structure comprises a second top gate dielectric positioned on the second channel layer, a second filler layer positioned on the second top gate dielectric and two second top gate spacers positioned on two sides of the second top gate dielectric, and wherein the second top gate dielectric positioned between the second filler layer and the second channel layer and between the second filler layer and either of the two second top gate spacers has a thickness less than a thickness of the first top gate dielectric positioned between the first filler layer and the first channel layer and between the first filler layer and either of the two first top gate spacers;
wherein the first bottom gate structure comprises a first bottom gate electrode positioned on the substrate, two first bottom gate spacers positioned on and contacted with two sides of the first bottom gate electrode, and a first bottom gate dielectric positioned between the first bottom gate electrode and the first channel layer, wherein the two first bottom gate spacers include a plurality of empty spaces filed with air.

2. The semiconductor device of claim 1, wherein a first bottom work function layer positioned on the first top gate dielectric, and wherein the first filler layer positioned on the first bottom work function layer.

3. The semiconductor device of claim 2, wherein the first bottom work function layer has a thickness between about 10 angstroms and about 200 angstroms.

4. The semiconductor device of claim 2, further comprising a first top work function layer positioned between the first bottom work function layer and the first filler layer.

5. The semiconductor device of claim 4, wherein the first top work function layer has a thickness between about 10 angstroms and about 100 angstroms.

6. The semiconductor device of claim 1, further comprising two first contacts positioned on the two first source/drain regions.

7. The semiconductor device of claim 6, further comprising two first conductive layers positioned between the two first contacts and the two first source/drain regions.

8. The semiconductor device of claim 7, wherein each of the two first conductive layers has a thickness between about 2 nm and about 20 nm.

9. The semiconductor device of claim 6, further comprising a first bottom insulating layer positioned below the first bottom gate structure.

10. The semiconductor device of claim 9, further comprising a first channel separation layer positioned below the first bottom insulating layer, wherein the first channel separation layer is doped with phosphorus, arsenic, antimony, or boron.

11. The semiconductor device of claim 9, further comprising a first buffer layer positioned below the first bottom insulating layer, wherein the first buffer layer has a lattice constant different from a lattice constant of the substrate.

12. The semiconductor device of claim 4, wherein the second channel layer is at a same vertical level as the first channel layer.

13. A method for fabricating a semiconductor device, comprising:
providing a substrate;
forming a first bottom gate structure and a second bottom gate structure on the substrate;
forming a first channel layer on the first bottom gate structure and a second channel layer on the second bottom gate structure;
forming a first top gate structure on the first channel layer and a second top gate structure on the second channel layer; and
forming two first source/drain regions on two sides of the first channel layer and two second source/drain regions on two sides of the second channel layer;
wherein in step of forming a first top gate structure and a second top gate structure on the first channel layer comprises forming a first top gate dielectric positioned on the first channel layer, a first filler layer positioned on the first top gate dielectric and two first top gate spacers positioned on two sides of the first top gate dielectric, and forming a second top gate dielectric positioned on the second channel layer, a second filler layer positioned on the second top gate dielectric and two second top gate spacers positioned on two sides of the second top gate dielectric, wherein the second top gate dielectric positioned between the second filler layer and the second channel layer and between the second filler layer and either of the two second top gate spacers has a thickness less than a thickness of the first top gate dielectric positioned between the first filler layer and the first channel layer and between the first filler layer and either of the two first top gate spacers;
wherein the step of forming the first bottom gate structure comprises:
forming a layer of first semiconductor material, a layer of first insulating material, and a layer of second semiconductor material on the substrate;
forming a first dummy structure on the layer of second semiconductor material;
performing an etch process to form a plurality of recesses, and turn the layer of first insulating material into a first bottom gate dielectric and the layer of second semiconductor material into the first channel layer;
performing a lateral etch process to form a plurality of lateral recesses and turn the layer of first semiconductor material into the first bottom gate electrode; and
forming two first bottom gate spacers in the plurality of lateral recesses to contact with two sides of the first bottom gate electrode, wherein the two first bottom gate spacers include a plurality of empty spaces filed with air;
wherein the first bottom gate electrode, the two first bottom gate spacers, and the first bottom gate dielectric together form the first bottom gate structure.

14. The method for fabricating the semiconductor device of claim 13, wherein the first channel layer is formed of silicon, germanium, silicon germanium, indium gallium arsenide, indium arsenide, gallium antimonide, indium antimonide, or a combination thereof.

15. The method for fabricating the semiconductor device of claim 13, wherein the two first bottom gate spacers are formed of silicon oxide, silicon nitride, silicon oxynitride, or silicon nitride oxide.

16. The method for fabricating the semiconductor device of claim 13, wherein the two first bottom gate spacers have a porosity between about 10% and about 100%.

* * * * *